(12) United States Patent
Amarloo et al.

(10) Patent No.: US 11,137,432 B1
(45) Date of Patent: Oct. 5, 2021

(54) PHOTONIC CRYSTAL RECEIVERS

(71) Applicant: Quantum Valley Ideas Laboratories, Waterloo (CA)

(72) Inventors: Hadi Amarloo, Waterloo (CA); Jaime Ramirez-Serrano, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 17/142,012

(22) Filed: Jan. 5, 2021

Related U.S. Application Data

(60) Provisional application No. 62/990,244, filed on Mar. 16, 2020.

(51) Int. Cl.
| | |
|---|---|
| *G01R 29/08* | (2006.01) |
| *H01Q 17/00* | (2006.01) |
| *H01Q 1/00* | (2006.01) |
| *H01Q 15/24* | (2006.01) |

(52) U.S. Cl.
CPC ..... *G01R 29/0885* (2013.01); *G01R 29/0892* (2013.01); *H01Q 1/00* (2013.01); *H01Q 15/24* (2013.01); *H01Q 17/00* (2013.01)

(58) Field of Classification Search
CPC ....... G01R 29/0885; H01S 1/00; H01S 1/005; H01S 1/02; H01S 1/04; H01S 1/06
USPC .................... 342/1, 2, 3, 4; 385/12
See application file for complete search history.

(56) References Cited

U.S. PATENT DOCUMENTS

| | | | |
|---|---|---|---|
| 5,689,275 A | 11/1997 | Moore et al. | |
| 7,409,116 B1 | 8/2008 | Mackie et al. | |
| 7,492,329 B2 | 2/2009 | Wang et al. | |
| 8,643,532 B1 | 2/2014 | Puscasu et al. | |
| 8,906,470 B2 | 12/2014 | Overstolz et al. | |
| 10,605,840 B1 | 3/2020 | Amarloo et al. | |
| 10,823,775 B2 | 11/2020 | Anderson et al. | |

(Continued)

FOREIGN PATENT DOCUMENTS

| | | |
|---|---|---|
| CN | 102096068 | 6/2011 |
| CN | 209542832 | 10/2019 |
| WO | 2018221310 | 12/2018 |

OTHER PUBLICATIONS

WIPO, International Search Report and Written Opinion dated Jul. 5, 2021, in PCT/CA2021/050328, 10 pgs.

(Continued)

*Primary Examiner* — Daniel Munoz
(74) *Attorney, Agent, or Firm* — Henry Patent Law Firm PLLC

(57) ABSTRACT

In a general aspect, a receiver is disclosed for sensing radio frequency (RF) electromagnetic radiation. The receiver includes a dielectric body having an array of cavities ordered periodically to define a photonic crystal structure in the dielectric body. The dielectric body also has a region in the array of cavities that defines a defect in the photonic crystal structure. An elongated slot through the region extends from a slot opening in a surface of the dielectric body at least partially through the dielectric body. The receiver also includes a vapor or a source of the vapor in the elongated slot as well as an optical window covering the elongated slot. The optical window has a window surface bonded to the surface of the dielectric body to form a seal about the slot opening.

30 Claims, 21 Drawing Sheets

(56) References Cited

U.S. PATENT DOCUMENTS

| | | | |
|---|---|---|---|
| 10,859,981 | B1 | 12/2020 | Ramirez-Serrano et al. |
| 10,971,818 | B2 | 4/2021 | Urzhumov |
| 10,979,147 | B2 | 4/2021 | Gordon et al. |
| 2001/0050641 | A1 | 12/2001 | Itoh et al. |
| 2005/0007118 | A1 | 1/2005 | Kitching et al. |
| 2006/0076518 | A1 | 4/2006 | Barker et al. |
| 2006/0147213 | A1 | 7/2006 | Rosenwald et al. |
| 2006/0239688 | A1 | 10/2006 | Hillis et al. |
| 2007/0210956 | A1 | 9/2007 | Hillis et al. |
| 2011/0001063 | A1 | 1/2011 | Barker et al. |
| 2013/0270434 | A1 | 10/2013 | Nelson et al. |
| 2014/0160474 | A1 | 6/2014 | Keller et al. |
| 2014/0248020 | A1* | 9/2014 | Fujita ............ G02B 6/1225 385/14 |
| 2015/0185256 | A1 | 7/2015 | Funinoki |
| 2015/0192532 | A1 | 7/2015 | Clevenson et al. |
| 2016/0178843 | A1 | 6/2016 | Fujita et al. |
| 2016/0218726 | A1* | 7/2016 | Overstolz ............ H03L 7/26 |
| 2016/0363617 | A1 | 12/2016 | Anderson et al. |
| 2017/0336695 | A1 | 11/2017 | Puscasu |
| 2018/0284780 | A1 | 10/2018 | McWhirter et al. |
| 2019/0058232 | A1 | 2/2019 | Fruehling et al. |
| 2019/0187198 | A1 | 6/2019 | Anderson et al. |
| 2019/0386364 | A1 | 12/2019 | Liang et al. |
| 2020/0006860 | A1 | 1/2020 | Othmezouri et al. |

OTHER PUBLICATIONS

Knapkiewicz, "Technological Assessment of MEMS Alkali Vapor Cells for Atomic References", micromachines, 10,25, Dec. 31, 2018, 20 pgs.

Amarloo, et al., "Terahertz Line Defect Waveguide Based on Silicon-on-Glass Technology", IEEE Transactions on Terahertz Science and Technology, vol. 7, No. 4, Jul. 2017, 7 pgs.

Anderson, et al., "An atomic receiver for AM and FM radio communication", arXiv:1808.08589v1, Aug. 26, 2018, 6 pgs.

Cox, et al., "Quantum-Limited Atomic Receiver in the Electrically Small Regime", arXiv:1805.09808v2, Jun. 19, 2018, 6 pgs.

Fan, et al., "Atom based RF electric field sensing", Journal of Physics B: Atomic, Molecular and Optical Physics, Sep. 9, 2015, 17 pgs.

Fan, et al., "Effect of Vapor-Cell Geometry on Rydberg-Atom-Based Measurements of Radio-Frequency Electric Fields", Physical Review Applied 4, 044015, 2015, 7 pgs.

Gosele, et al., "Wafer bonding for microsystems technologies", Sensors and Actuators 74, 161-168, 1999, 8 pgs.

Holloway, et al., "Detecting and Receiving Phase Modulated Signals with a Rydberg Atom-Based Mixer", arXiv:1903.10644v1, Mar. 26, 2019, 5 pgs.

Masteika, et al., "A Review of Hydrophilic Silicon Wafer Bonding", ECS Journal of Solid State Science and Technology, 3 (4) Q42-Q54, 2014, 13 pgs.

Meyer, et al., "Digital Communication with Rydberg Atoms & Amplitude-Modulated Microwave Fields", arXiv:1803.03545v2, Oct. 29, 2018, 10 pgs.

Scullion, et al., "Slotted Photonic Crystal Sensors", Sensors 2013, 13, 3675-3710, Mar. 15, 2013, 36 pgs.

Sedlacek, et al., "Atom-Based Vector Microwave Electrometry Using Ribidium Rydberg Atoms in a Vapor Cell", Physical Review Letters, Aug. 6, 2013, 5 pgs.

Sedlacek, et al., "Quantum Assisted Electrometry using Bright Atomic Resonances", arXiv:1205.4461v1 [physics.atom-ph], May 20, 2012, 15 pgs.

Suni, et al., "Effects of Plasma Activation on Hydrophilic Bonding of Si and SiO2", Journal of the Electrochemical Society, 149 (6) G348-G351,2002, 4 pgs.

USPTO, Notice of Allowance dated Jun. 7, 2021, in U.S. Appl. No. 17/201,830, 17 pgs.

USPTO, Non-Final Office Action dated Jun. 15, 2021, in U.S. Appl. No. 17/142,017, 29 pgs.

WIPO, International Search Report and Written Opinion dated Jun. 3, 2021, in PCT/CA2021/050341, 9 pgs.

Dharanipathy, "On the Investigation of Light-Matter Interactions in Slab Photonic Crystal Cavities", Thesis EPFL, Feb. 21, 2014, 186 pgs.

Dhillon, et al., "The 2017 terahertz science and technology roadmap", Journal of Physics D: Applied Physics, 2017, 49 pgs.

Withayachumnankul, et al., "Integrated Silicon Photonic Crystals Toward Terahertz Communications", Advanced Optical Materials 6.16, 2018, 7 pgs.

Edde, "Radar: Principles, Technology, Applications", Prentice Hall, PTR, Upper Saddle River, NJ, 1995, 77 pgs.

Glaser, "Fifty years of bistatic and multistatic radar", IEEE Proceedings, vol. 133, Pt. F, No. 7, Dec. 1986, 8 pgs.

Griffiths, "Multistatic, MIMO and Networked Radar: the Future of Radar Sensors?", Proceedings of the 7th European Radar Conference, Sep. 30-Oct. 1, 2010, 4 pgs.

Howard, et al., "A Geometric View of Multistatic Radar Detection", IEEE Asilomar, 2018, 5 pgs.

Inggs, et al., "Multistatic Radar: System Requirements and Experimental Validation", International Radar Conference, 10.1109/RADAR.2014.7060435, 2014, 6 pgs.

Norland, "Digital Signal Processing in Binary Phase Coded CW Multistatic Radar", IEEE Radar, 2003, 4 pgs.

Sedlacek, et al., "Microwave electrometry with Rydberg atoms in a vapour cell using bright atomic resonances", Nature Physics 8, Nov. 2012, 6 pgs.

Weiss, "Synchronisation of Bistatic Radar Systems", IEEE, 2004, 4 pgs.

WIPO, International Search Report and Written Opinion dated Jun. 17, 2021, in PCT/CA2021/050329, 7 pgs.

* cited by examiner

PHOTONIC CRYSTAL RECEIVERS

CROSS-REFERENCE TO RELATED APPLICATIONS

This application claims priority to U.S. Provisional Application No. 62/990,244, which was filed on Mar. 16, 2020 and entitled, "Photonic Crystal Receivers." The disclosure of this priority application is hereby incorporated by reference in its entirety.

BACKGROUND

The following description relates to photonic-crystal receivers.

Receivers are typically used to convert electromagnetic radiation to useable form. For example, a receiver may be used in a radar system to detect radio frequency electromagnetic radiation that has been scattered off objects. In some systems, a transmitter of the radar system emits a strong RF signal which then propagates towards a target; the target then scatters the RF radiation which is subsequently detected by a receiver. In some forms of cooperative radar, the target emits a signal that is detected by the receiver. Other applications are possible for receivers, such as in telecommunications systems.

DETAILED DESCRIPTION

Figure 1A:
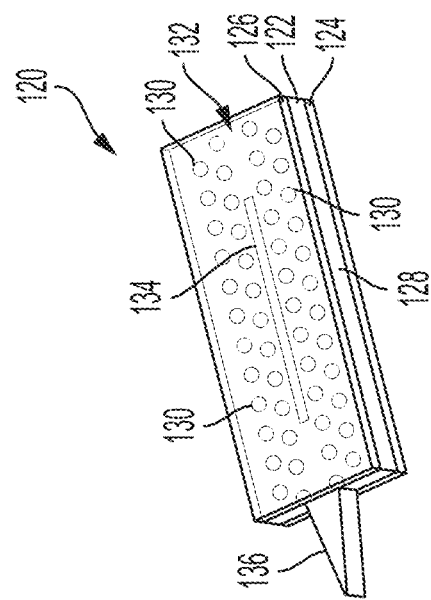
FIG. 1A is a schematic diagram of an example stemless vapor cell and an example photonic crystal receiver.

Receivers typically convert electromagnetic radiation to a usable form. In some aspects of what is described herein, photonic crystal receivers operate using atoms in a vapor state, which may correspond to Rydberg atom-based sensing. In many variations, the photonic crystal receivers are configured to take radio frequency (RF) waves at MHz-THz frequencies and transduce the waves into an optical signal that can be converted to an electrical signal (e.g., using a photodetector). Production of the optical signal is assisted by the atoms in the vapor state, which serves as a transducing medium and interacts with the RF waves. In some implementations, the photonic crystal receivers enhance the electric field of the RF waves at the position of the vapor or Rydberg atoms. For example, the photonic crystal receivers may concentrate the RF waves in a waveguide and slow them down using a photonic crystal. Such enhancement can increase the sensitivity of the photonic crystal receivers to a magnitude better than or comparable to conventional radar receivers. In many implementations, the photonic crystal receivers include a monolithic photonic crystal frame that is operable to enhance the electric field of the RF waves (or RF electromagnetic radiation). In some implementations, the photonic crystal receivers are incorporated into a receiver system. The receiver system may include a laser and a fiber optic circuit to optically couple light from the laser to the photonic crystal receiver. The receiver system may also include detection and digital control systems capable of signal processing.

In some aspects of what is described herein, a photonic crystal receiver utilizes Rydberg atom-based sensing to provide high sensitivity to a target electromagnetic radiation at radio and mm-wave frequencies. Atoms in the vapor state are contained in the structure to sense the target electromagnetic radiation. The photonic crystal receiver may be constructed by creating a photonic crystal frame and then bonding one or two optical windows to the frame. Integrated into the frame is a silicon tapered antenna, which may also include a polarization filter. The photonic crystal frame may be formed of dielectric material, such as silicon. Other high dielectric materials with low loss (or low absorption), however, are possible, such as $BaLn_2Ti_4O_{12}$ (BLT) where Ln refers to one or more elements from the lanthanide group of the periodic table of elements. The optical windows may also be formed of dielectric material, such as glass or silicon. The dielectric materials of the frame and optical windows may be bonded through the assistance of adhesion layers (e.g., silicon or silicon dioxide) on the photonic crystal frame. The target electromagnetic radiation may then be read-out optically. Because the photonic crystal receiver can be manufactured accurately at scale and the sensors are atoms, the photonic crystal receiver can be self-calibrated.

The photonic crystal frame may include a line defect disposed in a periodic arrangement of holes that defines the photonic crystal. For example, the line defect may correspond to a row of "filled" holes—e.g., the absence of holes—in the periodic arrangement of holes. An elongated slot may be centered within the line defect to define a slot waveguide. A vapor may occupy the elongated slot, such a vapor of Group IA atoms (e.g., a vapor of cesium atoms, a vapor of rubidium atoms, etc.). The vapor in the elongated slot is operable to sense RF electromagnetic radiation (e.g., RF waves) incident on the photonic crystal frame. The RF electromagnetic radiation may be enhanced or intensified in the elongated slot and has a group velocity that travels slower due to the presence of the photonic crystal structure. An antenna structure (e.g., a tapered protrusion) and polarization filter can be designed to efficiently couple the RF electromagnetic radiation into the line defect and elongated slot.

During manufacture, the vapor may be introduced into the photonic crystal receiver under controlled vacuum (or partial pressure) conditions. Low temperature contact bonding may be used to vacuum seal the vapor in the elongated slot. Other methods of filling the slot with atoms may also be used. For example, a paraffin-encased alkali sample or a laser-activated getter (SAES) may be located in a cavity connected to the elongated slot through a conduit. These sources of the vapor may be activated later by directing energy into the sources (e.g., heating by laser). One of the optical windows, or a fill hole in one of the optical windows, can be contact bonded so that the vapor remains pure in the elongated slot. Anodic bonding of both windows is a possible sealing method as well. However, other methods of bonding—e.g., anodic bonding—require the application of high temperatures, high voltages, or both, to the photonic crystal frame and optical window(s) to form a bond. Such application can lead to significant outgassing, which may compromise the performance of the photonic crystal receiver. In some cases, pure vapors of atoms are used for electric field sensing based on Rydberg atoms (e.g., pure vapors of cesium atoms). In some variations, a small stem may be used to fill the photonic crystal receiver. In these variations, both optical windows may be anodically bonded or frit bonded to the photonic crystal frame, before loading the vapor into the elongated slot through the stem.

The photonic crystal frame may include one or more tapers to minimize coupling losses between the different sections of the photonic crystal receiver through impedance matching. For example, during operation, the photonic crystal frame may capture the RF electromagnetic radiation with a tapered protrusion that extends from an end of the dielectric body. The tapered protrusion defines an antenna structure, and in some instances, includes a polarizer to filter a specific polarization. The periodic arrangement of holes in the photonic crystal frame may also be tapered (or offset) to slow a target RF electromagnetic wave down in a controlled manner. A second coupler can be used to couple the captured or received wave into the region (or elongated slot) within the photonic crystal frame. For example, the second coupler may be a taper internal to the tapered protrusion that is defined by one or more channels therein. In some variations, the photonic crystal frame includes a photonic crystal cavity to amplify the field strength of the RF electromagnetic radiation in the line defect (or elongated slot). A photonic crystal cavity can be implemented by tapering (or offsetting) the hole distance proximate one or both ends of the line defect to make those regions reflect the RF electromagnetic radiation back and forth along the axis of the photonic crystal receiver. In some variations, the photonic crystal frame may be configured to capture electromagnetic waves of a target frequency or range of frequencies, such as by selecting a size or spacing of the periodic arrangement of holes.

The photonic crystal receiver may be optically coupled to two or more read-out lasers (e.g., a coupling laser and a probe laser) during operation. Such optical coupling may occur through free space, by waveguides such as optical fiber, or some combination thereof. During operation, the effect of the target electromagnetic field on the vapor is encoded in light fields, which can be transported to a detector. Signals generated by the detector can subsequently be processed using either analog or digital electronics. Various modulation techniques may also be used with the light beams from the lasers to enhance the sensitivity of the photonic crystal receiver. Examples of such modulation techniques include frequency, amplitude, or phase modulation methods.

In some variations, the photonic crystal frame of the photonic crystal receiver includes a photonic crystal structure with a band gap for one or both of a transverse magnetic (TM) radiation and a transverse electric (TE) radiation. The photonic crystal structure may include a periodic arrangement of voids or cavities (e.g., a periodic arrangement of holes), and the TM and TE radiation may correspond to a specific target frequency or range of frequencies. The photonic crystal frame may also be configured to be sensitive to a polarization of the TM and TE radiation. The photonic crystal structure of the receiver, in some variations, serves to reduce a group velocity of the target electromagnetic radiation, thereby increasing the interaction time with the vapor located in the elongated slot, as well as the strength of the electric field.

Certain conventional manufacturing methods for constructing vapor cells that contain vapor or Rydberg atoms for sensing electromagnetic radiation rely on glass blowing, which can be imprecise and difficult to use when making small structures. For improved precision, photonic crystal receivers can be manufactured using precise machining processes (e.g. lasers and lithography) and low-temperature bonding processes. For example, the photonic crystal frame can be machined from silicon using a laser and then contact bonded to at least one optical window. Since the sealing bond between the photonic crystal frame and optical window(s) can form around 150° C. or lower, anti-spin relaxation coatings can be applied to the photonic crystal receivers (e.g., one or both optical windows) to increase the integration times. As such, the photonic crystal receivers may also be used in other applications, such as for vapor cell magnetometry. The precise machining processes described herein allow the photonic crystal receivers to be self-calibrated. Self-calibration is useful for accomplishing tasks like eliminating clutter in multi-static radar systems. Moreover, different receivers' respective signal levels can be compared to each other in an absolute sense.

In many implementations, the photonic crystal receivers described herein are monolithically configured. For example, the example photonic crystal receivers shown in the drawings are not enclosed in an outer vapor cell and have no blown glass parts, either of which, can distort incident electromagnetic radiation, decreasing efficiency. The photonic crystal receivers may also include seamless integration of a light-slowing structure, a slot structure, and a photonic cavity structure into a single vapor cell forming a unique waveguide. This configuration is amenable to automated manufacturing and can readily scale to large production volumes.

In many variations, the components of photonic crystal receivers are made of all-dielectric materials so that multiple instances can be placed in the same vicinity. This close placement allows operation as closely-spaced groups of photonic crystal receivers. The dielectric materials allow groups of photonic crystal receivers to operate with minimal interference from neighboring receivers and notably reduced cross coupling. Interference and cross-coupling are significant problems in radar and communications when multiple antennas must be placed in the same area.

Now referring to FIG. 1A, a schematic diagram is presented of an example stemless vapor cell 100 and an example photonic crystal receiver 120. The example stemless vapor cell 100 includes a dielectric body 102 disposed between (and bonded to) two optical windows 104, 106. The dielectric body 102 of the example stemless vapor cell 100 includes a cylindrical cavity 108 that contains a vapor (e.g., a vapor of Cs atoms). The example photonic crystal receiver 120 also includes a dielectric body 122 disposed between (and bonded to) two optical windows 124, 126. However, unlike the example stemless vapor cell 100, the dielectric body 122 of the example photonic crystal receiver 120 defines a photonic crystal frame 128 (or structure). The photonic crystal frame 128 includes a periodic arrangement of holes 130 that defines a photonic crystal therein. The photonic crystal frame 128 also includes a defect 132 in the periodic arrangement of holes 130. The defect 132 may correspond to a row of "filled" holes—e.g., the absence of holes—in the periodic arrangement of holes 130.

An elongated slot 134 may be centered within the defect 132. The periodic arrangement of holes 130, the defect 132, and the elongated slot 134 may operate in tandem to define a waveguide in the photonic crystal frame 128. A vapor may occupy the linear cavity, such as a vapor of Group IA atoms (e.g., a vapor of cesium atoms, a vapor of rubidium atoms, etc.). In many variations, the photonic crystal frame 128 includes an antenna structure 136, such as a tapered protrusion, for coupling to electromagnetic radiation (e.g., RF radiation) incident on the example photonic crystal receiver 120. The features of the photonic crystal frame 128 improve a sensitivity of the example photonic crystal receiver 120 to electromagnetic radiation (e.g., electric fields), especially relative to the example stemless vapor cell 100. Such improvement may be at least three orders of magnitude (i.e., $10^3$) higher. The features of the photonic crystal frame 128 may also allow the example photonic crystal receiver 120 to be highly sensitive to a polarization of the electromagnetic radiation.

Figure 2:
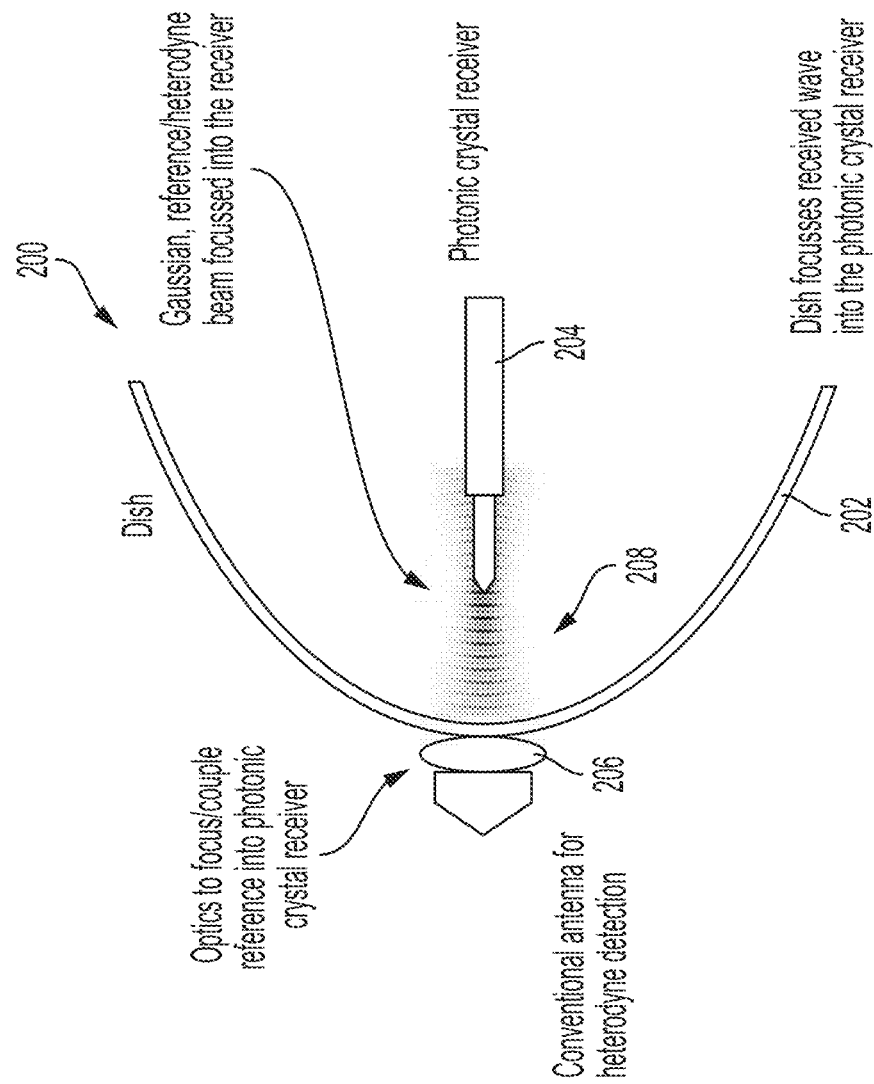
FIG. 2 is a schematic diagram of an example antenna that includes a dish and a photonic crystal receiver.

The example photonic crystal receiver 120 may be used with a dish to further improve its sensitivity to electromagnetic radiation. For example, FIG. 2 presents a schematic diagram of an example antenna 200 that includes a dish 202 and a photonic crystal receiver 204. The example antenna 200 may be configured for heterodyne detection. The dish 202 has a parabolic cross section defining a focal point, and the photonic crystal receiver 204 is disposed at (or adjacent to) the focal point to receive electromagnetic radiation focused by the dish 202. The example antenna 200 also includes optics 206 at an apex of the dish 202 to focus a Gaussian or reference/heterodyne beam 308 into the photonic crystal receiver 204. The reference beam may be an electromagnetic wave generated by an antenna whose frequency is close to or at the target electromagnetic field carrier frequency. It can be used to do heterodyne detection, which may involve making the overall receiver somewhat metallic. The antenna can be made small and can be advantageous since it can be used at low emission powers to carry-out heterodyne detection of the target electromagnetic field.

The example photonic crystal receiver 120 may be configured to concentrate and slow down an incident field so that the sensitivity of the receiver to high frequency electromagnetic fields (MHz-THz) is increased by a factor greater than 1000 when compared to a bare vapor cell, such as the stemless vapor cell 100. A photonic crystal cavity can also be used to further increase the electromagnetic field intensity. The cavity can be implemented by changing the tapers at the ends of the photonic crystal waveguide to make reflective structures. The example photonic crystal receiver 120 may include a tapered coupler that can serve as a polarizer, if desired, and may also include a taper to reduce loss in coupling into the slot waveguide, and may further include a tapered array of holes for slowing the incident electromagnetic wave in a controlled manner so that losses are reduced. The example photonic crystal receiver 120 can use a dish (e.g., dish 202 of FIG. 2) to focus incoming electromagnetic radiation onto a coupler. These different features can be used independently or in any combination. In many configurations, the example photonic crystal receiver 120 is a compact, self-calibrated, all dielectric receiver that out-performs conventional receivers and competes with the best receivers in sensitivity. As used herein, the term "all dielectric" refers to a material construction that is more electromagnetically transparent than conventional receivers. Several instances of the example photonic crystal receiver 120 can be grouped together with minimal interference and cross-coupling due to their dielectric construction. The example photonic crystal receiver 120 can also exhibit enhanced polarization sensitivity over conventional antennas. The example photonic crystal receiver 120 is designed in a way that it can be reliably automated and mass produced for commercialization.

Figure 1A:
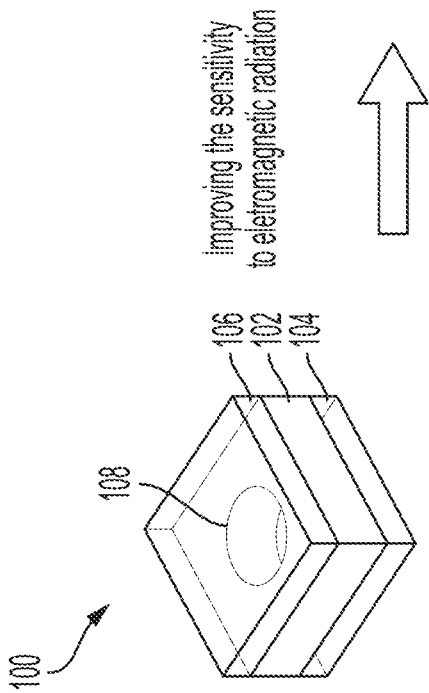
Figure 1B:
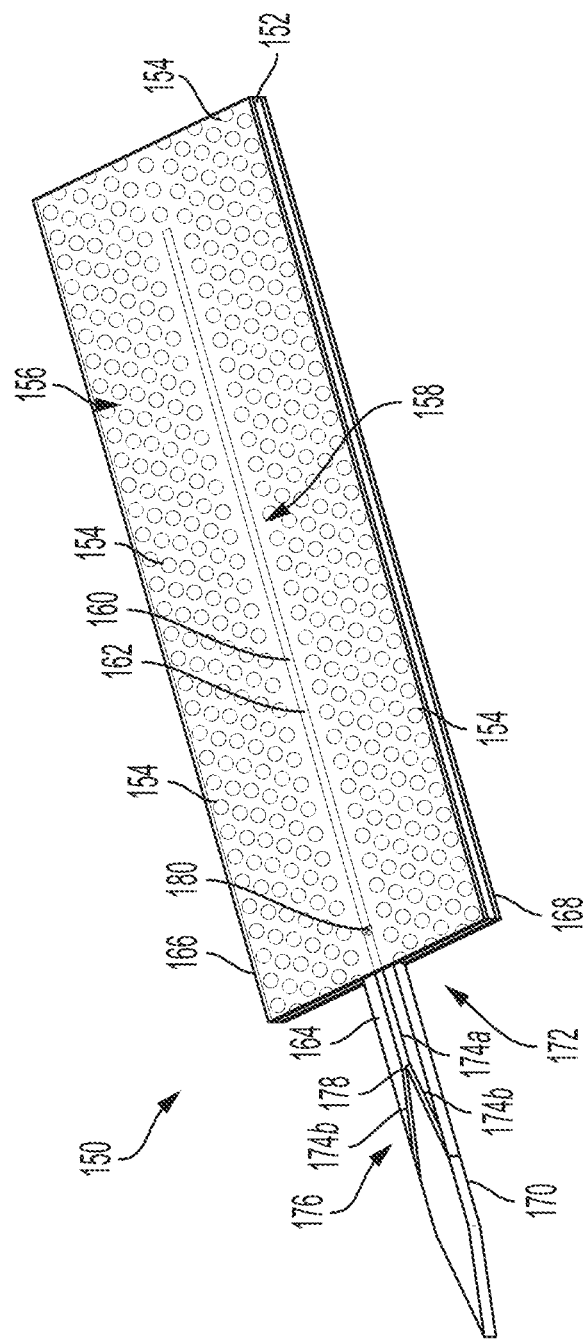
FIG. 1B is a schematic diagram, in perspective view, of an example receiver for sensing radio frequency (RF) electromagnetic radiation.

Now referring to FIG. 1B, a schematic diagram is presented, in perspective view, of an example receiver 150 (or example photonic crystal receiver 150) for sensing radio frequency (RF) electromagnetic radiation. The example receiver 150 may be analogous to the photonic crystal receiver 120 described in relation to FIG. 1A, and the RF electromagnetic radiation may have a frequency (or frequencies) within the range from 1 MHz to 1 THz. The example receiver 150 includes a dielectric body 152, which may be formed of a material substantially transparent to electric fields (or electromagnetic radiation) measured by the example receiver 150. The material may be an insulating material having a high resistivity, e.g., $\rho > 10^3$ $\Omega \cdot cm$, and may also correspond to a single crystal material, a polycrystalline material, or an amorphous (or glass) material. For example, the dielectric body 152 may be formed of silicon. In another example, the dielectric body 152 may be formed of a glass that includes silicon oxide (e.g., $SiO_2$, $SiO_x$, etc.), such as vitreous silica, a borosilicate glass, or an aluminosilicate glass. In some instances, the material of the dielectric body 152 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In certain variations, the combination may correspond to $BaLn_2Ti_4O_{12}$ where Ln refers to one or more elements from the lanthanide group of the periodic table of elements. In other instances, the material of the dielectric body 152 is a non-oxide material such as silicon (Si), diamond (C), gallium nitride (GaN), calcium fluoride (CaF), and so forth.

The dielectric body 152 includes an array of cavities 154 ordered periodically to define a photonic crystal structure 156 in the dielectric body 152. The array of cavities 154 may extend either partially or completely through the dielectric body 152. For example, the array of cavities 154 may be an array of blind holes, or as shown in FIG. 1B, an array of through-holes. The array of cavities 154 may also be partitioned into portions extending partially or completely through the dielectric body 152. For example, the array of cavities 154 may include a first portion extending partially through the dielectric body (e.g., blind holes) and a second portion extending completely through the dielectric body (e.g., through-holes). Although FIG. 1B depicts the array of cavities 154 as being an array of circular through-holes, other shapes are possible for the array of cavities 154 (e.g., hexagonal, oblong, etc.). In some variations, each of the array of cavities 154 has a maximum dimension in a range from 0.5 millimeters to 10 millimeters. The maximum dimension may be the same for each cavity. In some variations, the array of cavities 154 has a periodic spacing in a range from 0.9 millimeters to 15 millimeters. In some variations, the dielectric body 152 is a plate having a thickness in a range from 0.5 millimeters to 10 millimeters.

The dielectric body 152 also includes a region 158 in the array of cavities 154 defining a defect in the photonic crystal structure 156. In many variations, the region 158 is a solid region in the array of cavities 154 defined by an absence of cavities. The absence of cavities may correspond to the defect in the photonic crystal structure 156. For example, the defect may be a row or column of "filled" cavities. However, other patterns of "filled" cavities are possible. In some variations, such as shown in FIG. 1B, the region 158 may be disposed in a center of the dielectric body 152. The dielectric body 152 additionally includes an elongated slot 160 through the region 158 extending from a slot opening 162 in a surface 164 of the dielectric body 152 at least partially through the dielectric body 152. In some variations, such as shown in FIG. 1B, the elongated slot 160 is disposed in a center of the region and align along a longitudinal axis of the dielectric body 152. It will be appreciated that, during operation of the example receiver 150, the photonic crystal structure 156, the region 158, and the elongated slot 160 may function in tandem as a waveguide for the RF electromagnetic radiation.

In some implementations, the photonic crystal structure 156 defines a photonic band gap for the example receiver 150. For example, the photonic crystal structure 150 may define a photonic band gap associated with a transverse magnetic (TM) mode of RF electromagnetic radiation. In another example, the photonic crystal structure 156 may define a photonic band gap associated with a transverse electric (TE) mode of RF electromagnetic radiation. Combinations of TM and TE modes for RF electromagnetic radiation are also possible.

In some implementations, the photonic crystal structure 156 is configured to decrease a group velocity of a target RF electromagnetic radiation having a frequency in a range from 100 MHz-1 THz. Such configuration may involve selecting a size of one or more cavities in the array of cavities 154, selecting a spacing of one or more cavities in the array of cavities 154, selecting an ordering of the array of cavities 154, and/or selecting a thickness of the dielectric body 152. Other characteristics are possible (e.g., selecting the material of the dielectric body 152). In some cases, the configuration of the photonic crystal structure 156 may be determined through numerical modeling. An example configuration for decreasing a group velocity of a target RF electromagnetic radiation is described below in relation to FIGS. 7, 9A-9B, and 12A-12C.

In some implementations, the photonic crystal structure 156 is configured to concentrate a target RF electromagnetic radiation in the elongated slot 160. The target RF electromagnetic radiation has a frequency in a range from 100 MHz-1 THz. Such configuration may involve selecting a size of one or more cavities in the array of cavities 154, selecting a spacing of one or more cavities in the array of cavities 154, selecting an ordering of the array of cavities 154, and/or selecting a thickness of the dielectric body 152. Other characteristics are possible (e.g., selecting the material of the dielectric body 152). In some cases, the configuration of the photonic crystal structure 156 may be determined through numerical modeling. An example configuration for concentrating a target RF electromagnetic radiation in an elongated slot is described below in relation to FIGS. 8A-8B and 12A-12C.

In some implementations, the photonic crystal structure 156 may include a photonic crystal mirror configured to redirect (e.g., reflect) a target RF electromagnetic radiation. For example, the array of cavities 154 may include one or more offset cavities that are spatially offset from an ideal periodic position in the array 154. The one or more offset cavities may define the photonic crystal mirror. In some variations, the one or more offset cavities reside nearest an end of the elongated slot and have respective spatial offsets away from the end of the elongated slot. In some variations, the one or more offset cavities reside nearest a side of the elongated slot and have respective spatial offsets away from the side of the elongated slot.

The example receiver 150 may also include a vapor or a source of the vapor in the elongated slot 160. The vapor may include constituents such as a gas of alkali-metal atoms, a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents. The source of the vapor may generate the vapor in response to an energetic stimulus, such as heat, exposure to ultraviolet radiation, irradiation by laser light, and so forth. For example, the vapor may correspond to a gas of alkali-metal atoms and the source of the vapor may correspond to an alkali-metal mass sufficiently cooled to be in a solid or liquid phase when disposed into the elongated slot 160.

The example receiver 150 may additionally include an optical window 166 covering the elongated slot 160 and having a window surface bonded to the surface 164 of the dielectric body 152 to form a seal about the slot opening 162. The optical window 166 may be bonded to the dielectric body 152 using a contact bond, an anodic bond, a glass frit bond, and so-forth. Such bonds may be formed using techniques described in U.S. Pat. No. 10,859,981 entitled "Vapor Cells Having One or More Optical Windows Bonded to a Dielectric Body," the disclosure of which, is incorporated herein by reference in its entirety. The optical window 166 may be formed of a material that is transparent to electromagnetic radiation (e.g., laser light) used to probe the vapor. For example, the optical window 166 may be transparent to infrared wavelengths of electromagnetic radiation (e.g., 700-5000 nm), visible wavelengths of electromagnetic radiation (e.g., 400-700 nm), or ultraviolet wavelengths of electromagnetic radiation (e.g., 10-400 nm). Moreover, the material of the optical windows 166 may be an insulating material having a high resistivity, e.g., $\rho > 10^3$ $\Omega \cdot cm$, and may also correspond to a single crystal material, a polycrystalline material, or an amorphous (or glass) material. For example, the material of the optical window 166 may include silicon oxide (e.g., $SiO_2$, $SiO_x$, etc.), such as found within quartz, vitreous silica, or a borosilicate glass. In another example, the material of the optical window 166 may include aluminum oxide (e.g., $Al_2O_3$, $Al_xO_y$, etc.), such as found in sapphire or an aluminosilicate glass. In some instances, the material of the optical window 166 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, $BaLn_2Ti_4O_{12}$, etc.). In other instances, the material of the optical window 166 is a non-oxide material such as diamond (C), calcium fluoride (CaF), and so forth.

In some implementations, the optical window 166 covers only the elongated slot 160 and the surface 164 of the dielectric body 152 immediately adjacent the elongated slot 160 (e.g., the region 158 or portion thereof). However, in some implementations, the optical window 166 also covers the surface 164 of the dielectric body 152 associated with the photonic crystal structure 156. In these implementations, such as shown in FIG. 1B, the surface 164 of the dielectric body 152 defines a cavity opening for each of the array of cavities 154. The optical window 166 covers each of the cavity openings. Moreover, the window surface of the optical window 166 forms a seal about each of the cavity openings.

In implementations where the elongated slot 160 extends only partially through the dielectric body 152, a single optical window may be bonded to the dielectric body 152 to seal the vapor or source of the vapor in the elongated slot 160. However, in some implementations, the elongated slot 160 may extend through the dielectric body 152. In these implementations, two optical windows may be bonded to the dielectric body 152 to seal the vapor or source of the vapor in the elongated slot 160. For example, the surface 164 of the dielectric body 152 may be a first surface and the dielectric body 152 may include a second surface opposite the first surface. The elongated slot 160 may then extend through the dielectric body 152 from the first surface to the second surface. In this case, the slot opening 162 may be a first slot opening and the second surface of the dielectric body 152 may define a second slot opening of the elongated slot 160. The example receiver 150 may include a second optical window 168 covering the second slot opening, as shown in FIG. 1B. The second optical window has a second window surface bonded to the second surface of the dielectric body 152 to form a seal about the second slot opening.

In some implementations, the second optical window covers only the elongated slot 160 and the second surface of the dielectric body 152 immediately adjacent the elongated slot 160 (e.g., the region 158 or portion thereof). However, in some implementations, the second optical window also covers the second surface of the dielectric body 152 associated with the photonic crystal structure 156. For example, the first and second surfaces of the dielectric body 152 may define, respectively, first and second cavity openings for each of the array of cavities 154. In this case, the array of cavities 154 extends through the dielectric body 152 from the first surface to the second surface. The second optical window may then cover, respectively, each of the second cavity openings, as shown in FIG. 1B. Moreover, the second window surface may form a seal about each of the second cavity openings.

In some implementations, the dielectric body 152 includes an antenna structure 170 extending from an end 172 of the dielectric body 152 and aligned with the elongated slot 160. For example, the antenna structure 170 may be a protrusion extending from the end 172 of the dielectric body 152 and terminating in a taper. The antenna structure 170 may be configured to couple to a target RF electromagnetic radiation having a frequency in a range from 100 MHz-1 THz. Such configuration may involve selecting a length of the antenna structure 170, which may be determined by numerical simulation for the target RF electromagnetic radiation. Other dimensions may also be involved, including ratios of dimensions, e.g., thicknesses, widths, length-to-width ratios, length-to-thickness ratios, and so forth. The configuration of the antenna structure 170 for coupling to a target RF electromagnetic radiation may also involve selecting a shape of the antenna structure 170 or a degree of curvature of the antenna structure 170. The shape, the degree of curvature, or both, may also be determined by numerical simulation.

In some variations, the antenna structure 170 includes a polarizer, which may be integral to the antenna structure 170. For example, the antenna structure 170 may include a narrow portion aligned with the elongated slot 160. The antenna structure 170 may also include an array of co-planar segments extending outward from the narrow portion and having a periodic spacing therealong. The array of co-planar segments is configured to filter (or select) a polarization of the target RF electromagnetic radiation.

In some variations, the antenna structure 170 includes one or more channels 174 defining a taper 176 internal to the antenna structure 170. The taper 176 is configured to couple electromagnetic radiation received by the antenna structure 170, e.g., the target RF electromagnetic radiation, to the elongated slot 160. To do so, the taper 176 may have an apex 178 aligned with the elongated slot 160. For example, the antenna structure 170 may be a protrusion extending from the end 172 of the dielectric body 152. In this case, the antenna structure 170 may include a V-shaped channel defining a taper internal to the protrusion. The taper may have a tip (or apex) offset from an end of the elongated slot 160 aligned therewith. In an alternate case, such as shown in FIG. 1B, the antenna structure 170 may include a Y-shaped channel in the protrusion that includes a base portion 174$a$ and two branch portions 174$b$. The base portion 174$a$ is aligned with the elongated slot 160 and terminates in an end offset from an end of the elongated slot 160. The two branch portions 174$b$ split from the base portion 174$a$ to define a taper internal to the protrusion (e.g., taper 176). Other configurations are possible for the taper 176.

In operation, the example receiver 150 receives RF electromagnetic radiation at the antenna structure 170 of the dielectric body 152. In some instances, the example receiver 150 couples the received RF electromagnetic radiation to the elongated slot 160 using the taper 176 internal to the antenna structure. The example receiver 152 also interacts the received RF electromagnetic radiation with the photonic crystal structure 156. In such interaction, the photonic crystal structure 156 may decrease a group velocity of the received RF electromagnetic radiation along a direction parallel to the elongated slot 160. The photonic crystal structure 156 may also concentrate the received RF electromagnetic radiation in the elongated slot 160. The example receiver additionally passes input optical signals through the vapor in the elongated slot 160 to generate one or more output optical signals. The input optical signals may be produced by one or more lasers (e.g., a probe laser, a coupling laser, etc.). In some variations, the example receiver 150 may be used with a dish, such as the dish 202 described in relation to FIG. 2, to improve a sensitivity of the example receiver 150 to RF electromagnetic radiation.

In some implementations, passing the input optical signals includes propagating the input optical signals along an optical pathway defined by the elongated slot 160. In some implementations, passing the input optical signals includes reflecting the input optical signals off a mirror disposed at an end of the elongated slot. For example, the example receiver 150 may include a mirror 180 disposed at an end of the elongated slot 160. The mirror 180 may be angled relative to the optical pathway (e.g., angled at 45°), or as shown in FIG. 1B, be perpendicular to the optical pathway. Such orientations may allow the mirror 180 to direct light into the elongated slot 160, direct light along the elongated slot 160 through the vapor, and/or direct light out of the elongated slot 160. Example positions and orientations of the mirror 180 are described further in relation to FIGS. 5A-5E.

In some implementations, photonic crystal cavities and structures are ideal for integrating with alkali-based vapor cells by using methods for vapor cell bonding and machining. A photonic crystal structure that acts as a concentrating element for MHz-THz radiation can have cavities machined in it using lasers (e.g., a Protolaser R tool), mechanical machining, or deep reactive ion etching (DRIE). The cavities (e.g., an elongated slot) may subsequently be filled with vapor by, for example, sealing them in an alkali environment, placing paraffin coated alkali atoms within them, and/or placing laser activated getter sources within them. The photonic structures can be designed to concentrate and bunch the incident high frequency electric field in the vapor. Slowing down and amplifying the RF radiation field in the vapor increases the optical read-out response, thereby making the device more sensitive to the incident electromagnetic wave. The sensitivity of the atoms to the incident electromagnetic field is determined by the interaction time-with the incident RF electromagnetic field and the strength of the RF electromagnetic field at the position of the atoms. Both the slowing (decrease of the group velocity of the target electromagnetic wave) and the concentration of electric field in the slot of the photonic crystal receiver serve to enhance the sensitivity of the atoms to the target electromagnetic radiation by effectively increasing the strength of the electric field and the interaction time with the atoms. The photonic crystal structure is based on high dielectric constant materials (e.g., silicon) that can be contact bonded. Other high dielectric constant, low loss materials such as $BaLn_2Ti_4O_{12}$ (BLT) can be used, if adhesion layers are applied.

The photonic crystal receiver may function as a Rydberg atom-based radar receiver with an electric field sensitivity that is enhanced by a significant factor (e.g., a factor of approximate 1000, or another factor) compared to a bare vapor cell. The photonic crystal receiver may have a sensitivity at least equivalent to a conventional receiver and may be able to reach the thermal noise floor. Methods to fabricate the photonic crystal receiver include machining silicon and glass with lasers, thereby allowing the formation of microstructures in these materials with μm precision and less than 10 μm feature sizes. Such precision and feature scales are well suited for photonic crystal frames that interact with a radio frequency field, since the wavelength of the radio frequency field is much greater than 10 μm. The high accuracy of the machining process in relation to the wavelength of the target radiation may also reduce loss in the device.

The use of Rydberg atoms for electrometry has already led to the most accurate, absolute measurements of high frequency (GHz-THz) electric fields to date, ~1 μV/cm. The calculated atomic shot noise limit in the 5-25 GHz range is ~pV cm$^{-1}$ Hz$^{-1/2}$, for standard interaction volumes, determined by the number of participating atoms and the coherence time. The current sensitivity limits are determined by shot noise in the classical readout field. Conventional vapor cells used to demonstrate dielectric Rydberg atom-based sensing devices cannot be improved in sensitivity without using additional quantum resources (e.g., entanglement or squeezed light), which are presently impractical. A path forward to improve the sensitivity for a broad range of transformative communications and radar applications is to engineer the vapor cell to enhance the signal. The signal levels in a bare vapor cell are limited because ultimately the interaction of the atom with the incident electromagnetic field is determined by the absorption rate (or interaction rate) times the coherence time, i.e., the coupling constant between the atom and the field and how fast the atom decays. However, amplifying the electromagnetic field in the region of the atoms by concentrating it and slowing it down is a viable path forward to make a more sensitive receiver since these effects increase atomic response to the incident electromagnetic field amplitude. Precision manufacturing is advantageous, for example, to design these structures for specific frequencies, construct self-calibrated devices, and tailor the output signals.

In many variations, the photonic crystal receivers are formed of dielectric materials, thereby allowing the photonic crystal receivers to be clustered together with minimal interference and cross coupling. The photonic crystal receivers may sense different frequencies and polarizations. In many variations, the photonic crystal receivers have increased polarization sensitivity and may be capable of discriminating less than 0.05 degrees of polarization rotation. Polarization rotation discrimination refers to how much the polarization would have to rotate in order to resolve a change with a receiver.

In many variations, the sensitivity of the photonic crystal receivers is greater than −120 dBm with a 1 MHz bandwidth. The sensitivity does not include enhancements from a dish, which can further increase the sensitivity and is commonly used with a conventional receiver. For example, the photonic crystal receivers can support −110 dBm in a 1 MHz bandwidth at a center frequency of around 15 GHz. A 1 m$^2$ dish for this center frequency can increase the sensitivity of the photonic crystal receivers by close to 3 orders of magnitude.

In many variations, the photonic crystal receivers are lightweight, portable and less costly. The photonic crystal receivers may be based on diode laser technology and vapor cell technology. Reducing size, weight, and power (SWaP) is an important driver for many applications (e.g., telecommunication systems, modern radar systems, etc.). In many variations, the photonic crystal receivers are constructed so that they can be manufactured more easily than glass blown structures associated with conventional vapor cells. As such, the photonic crystal receivers are more robust, such as to mechanical forces, vibrations, and so forth.

In some implementations, the photonic crystal receivers may serve as receivers for radar because the bandwidths, pulse repetition rates, low SWaP, and advantages of being dielectric and polarization sensitive are well-suited for radar applications. Radar systems often use pulse repetition rates of ~100 Hz-100 kHz with pulse widths of ~1 ms-10 ns. These pulse widths translate to signal bandwidths ranging from kHz to 100 MHz. Photonic crystal receivers that, in may variations, utilize Rydberg atom-based sensing can meet these performance levels.

Figure 3:
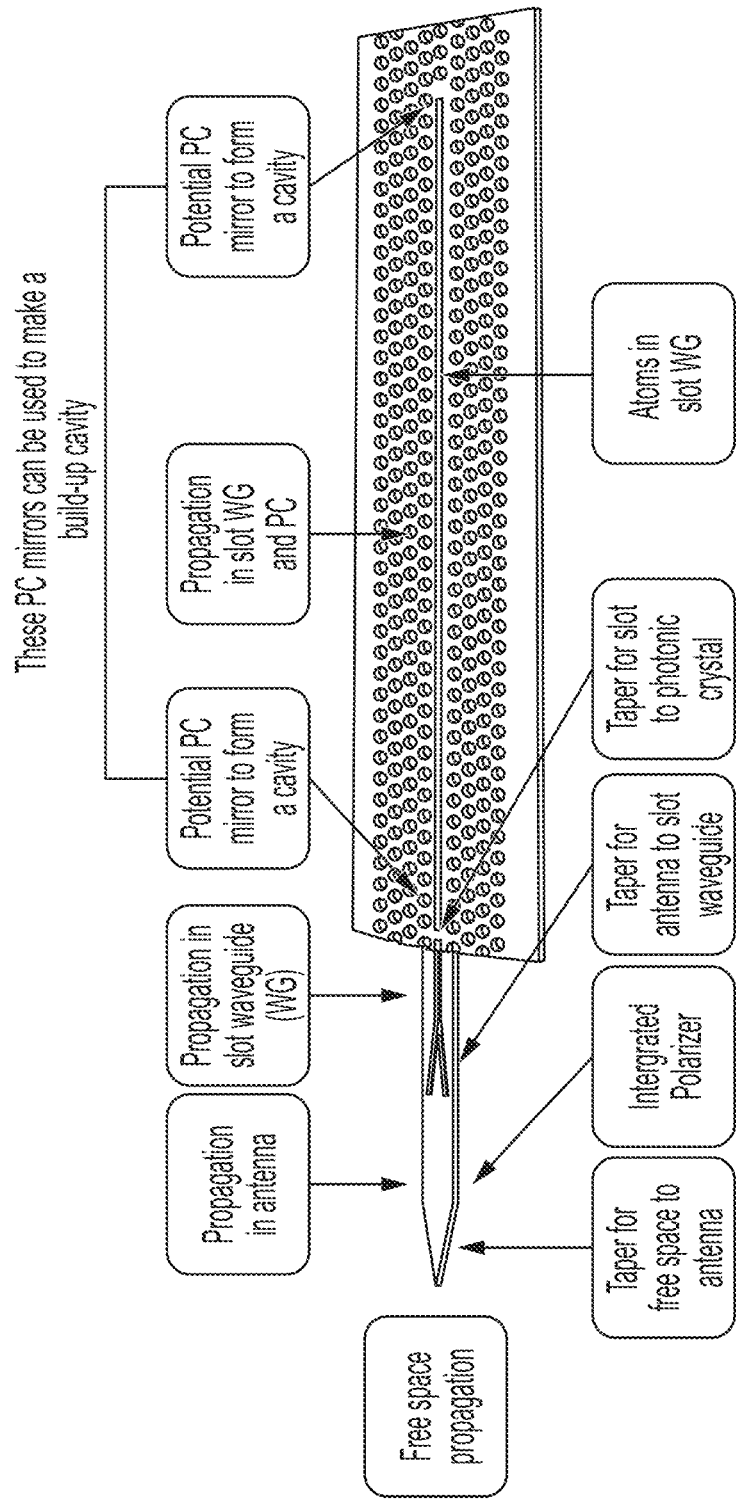
FIG. 3 is a schematic diagram of an example photonic crystal frame that includes a protrusion for receiving electromagnetic radiation and a periodic arrangement of holes.
Figure 4:
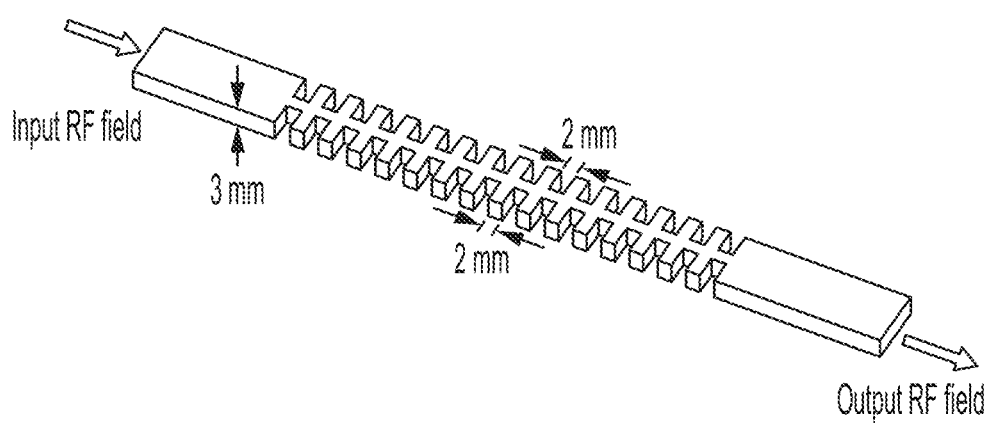
FIG. 4 is a schematic diagram of an example protrusion (or portion thereof) of a photonic crystal frame that includes a periodic array of segments disposed along a narrowed section of the example protrusion that serves as a polarizer.

Now referring to FIG. 3, a schematic diagram is presented of an example photonic crystal frame that includes a protrusion for receiving electromagnetic radiation and a periodic arrangement of holes. The protrusion may be configured to receive a target RF electromagnetic radiation and may include one or more tapered surfaces. In some variations, the protrusion may be configured to filter a polarization of the electromagnetic radiation. For example, FIG. 4 presents a schematic diagram of an example protrusion (or portion thereof) of a photonic crystal frame that includes a periodic array of segments disposed along a narrowed section of the example protrusion. The example protrusion may be 3 mm thick. However, other thicknesses are possible. Each segment extends outward and perpendicular to the narrowed section. The segments are spaced equally from each other by gaps, and the dimensions of the gaps may be the same as the dimensions of the segments. In some variations, the segments and gaps have a width of 2 mm. However, other dimensions are possible. The periodic array of segments is operable to filter a polarization of an input electromagnetic radiation (e.g., an RF field) and produce a filtered output electromagnetic radiation (e.g., a filtered RF field).

Now referring back to FIG. 3, the example photonic crystal frame also includes a line defect disposed in the periodic arrangement of holes that slows the target electromagnetic wave (so-called structural slow light). The line defect may correspond to a row of "filled" holes—e.g., the absence of holes—in the periodic arrangement of holes. A linear cavity may be centered within the line defect that defines a photonic crystal waveguide. Mirrors (e.g., Bragg mirrors) at each end of the linear cavity may help to define an optical pathway along the linear cavity, such as for probe and coupling laser beams. The probe and coupling laser beams may be used in electromagnetically induced transparency read-out in Rydberg atom-based sensing. A vapor may occupy the linear cavity, such a vapor of Group IA atoms (e.g., Cs, Rb, etc.). The vapor in the linear cavity is operable to interact with the target electromagnetic radiation incident on the example photonic crystal frame, which may be enhanced or intensified in the linear cavity. Optical signals (e.g., laser beams) traveling along the optical pathway may also interact with the vapor in the linear cavity, thereby transducing the atomic interaction with the target electromagnetic field into an optical signal suitable for determining properties of the target electromagnetic field (e.g., amplitude, phase, polarization, etc.).

The optical signals may enter and exit the linear cavity through fiber optic assemblies, and in some variations, one or more mirrors disposed in the linear cavity. For example, FIGS. 5A-5E present schematic diagrams, in cross-section, of alternate configurations of a photonic crystal receiver, each configuration having a different arrangement of fiber optic assemblies. The cross-sections are illustrated from a side perspective (i.e., holes parallel to the short dimension of FIGS. 5A-5E). The photonic crystal receiver includes a photonic crystal frame with a vapor (e.g., a vapor of Cs atoms) in a cavity. The cavity may extend from a first end to a second end along an axis (e.g., a linear axis) that is associated with an optical pathway. Depending on the configuration, the photonic crystal receiver may include one or two fiber optic assemblies coupled to the photonic crystal frame in optical communication with the optical pathway. In some configurations, such as shown in FIGS. 5B-5E, one or both of the first and second ends of the cavity include a mirror (e.g., a Bragg mirror). The mirror is operable to guide light along the optical pathway. The mirror may reflect light from an input fiber optic assembly into the cavity, reflect the light out of the cavity into an output fiber optic assembly, or both. The light may correspond to optical signals entering and exiting the cavity. The mirrors can be glued, precision-fit, or machined into the frame and coated to locate them into the channel.

Figure 6:
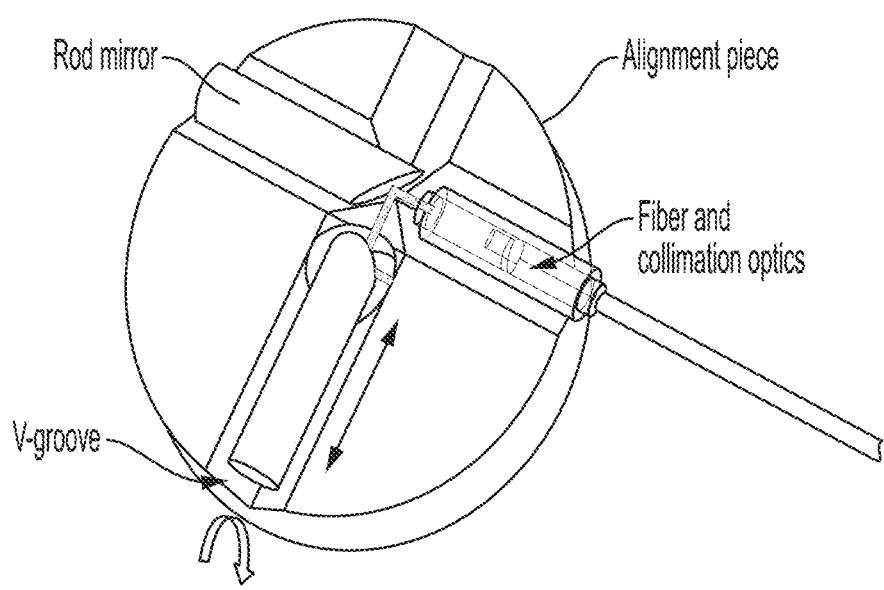
FIG. 6 is an example alignment piece configured to supply an optical signal and having a first rod mirror and a second rod mirror.

An alignment piece may be used to orient one or more fiber optic assemblies relative to the photonic crystal frame. In some variations, the alignment piece may be integral to the photonic crystal frame (or photonic crystal receiver). FIG. 6 presents an example alignment piece configured to supply an optical signal and having a first rod mirror and a second rod mirror. The example alignment piece may be formed of silicon, and in some variations, the first and second rod mirrors each include a reflective planar surface. The reflective planar surface may be oriented 45° to a longitudinal axis of the rod mirror. The example alignment piece may also include fiber and collimation optics configured to guide and shape an optical signal (e.g., a beam of laser light). The fiber and collimation optics may convey the optical signal to one of the reflective surfaces of the rod mirrors. In the example shown, the first and second rod mirrors are seated in respective V-shaped grooves that allow rotational motion of the rod mirrors. Such seating may include a glue or an adhesive bonding the first and second rod mirrors to their respective V-shaped grooves. The V-shaped grooves may also allow longitudinal motion of the rod mirrors. As such, the first and second rod mirrors may be positioned to direct the optical signal from the fiber and collimation optics through an orifice in the alignment piece.

Now referring back to FIG. 3, the example photonic crystal frame may be formed of silicon. However, other types of dielectric materials may be used. The example photonic crystal frame may also be sandwiched between and bonded to two optical windows. The optical windows may be formed of an optically transparent dielectric material, such as glass (e.g., fused silica, borosilicate glass, etc.). When bonded to the optical windows, the example photonic crystal frame (with a vapor in the linear cavity) may be configured as a photonic crystal receiver. It is also possible to bond smaller windows to the photonic crystal frame where the light is injected into the channel. For example, a silicon cap with holes at the position where the light enters the channel can be bonded to the photonic crystal frame. Optical windows can be bonded to the silicon cap where the holes for light injection are located.

In some instances, photonic crystal receivers provide a compact, all-dielectric construction and out-perform current receivers in functionality, e.g., electromagnetic transparency, self-calibration, and SWaP. Moreover, several photonic crystal receivers can be grouped together without interfering with one another because of their dielectric nature. Fully dielectric receivers are beneficial in many applications, such as in radar and communications. Advantages of a photonic crystal receiver based on Rydberg atom-based sensing technology may include, in various implementations, one or more of the following: [1] the receiver can act as its own filter, [2] there are no amplifiers required to reach the standard performance, [3] multiple receivers can be grouped together with minimal interference and cross-coupling, [4] the receiver can be sensitive to polarization, and [5] the receiver is self-calibrated. Other advantages are possible. Grouping of photonic crystal receivers to sense orthogonal polarizations of return signals, even at different frequencies is possible. The small, compact size, use of diode lasers and low power electronics, and elimination of a power amplifier are advantages for portable and compact radar systems, particularly multi-static ones, as well as communication systems (e.g., telecommunications).

In some implementations, a photonic crystal receiver is configured for weather radar applications. The photonic crystal receiver, when constructed of dielectric materials, can be more polarization sensitive than conventional metal antennas. Increasing the polarization sensitivity can lead to better discrimination of object shapes. Waveguides can be highly polarization sensitive, especially with a polarizer segment integrated within the waveguide or the initial coupling stage. The increased accuracy on differential return, differential phase and correlations between different polarizations can allow models for quantitative precipitation estimates to become truly predictive. The photonic crystal receiver can use multiple frequencies, which further constrains models of rain, snow and ice characterization. The prediction of weather, particularly for early warning in catastrophic conditions, like tornadoes and severe thunderstorms, is a multi-billion-dollar industry. In the United States, a better multi-frequency radar system, such as those allowed by the photonic crystal receiver, can possibly replace 4 different networks consisting of National Weather Surveillance Radar, Terminal Doppler Radar, Airport Surveillance Radar, and Air Route Surveillance Radar, and lead to enormous cost savings. In communications, there are similar applications such as a lightweight receiver that can identify the origin of emissions, allowing the identification of jamming signals; and multi-frequency communications systems that have to be located in compact spatial locations (e.g., drones).

In some implementations, a photonic crystal frame allows a photonic crystal receiver to improve electric field sensitivity by about 10 times by slowing electromagnetic radiation, by about 20 times from build-up in the cavity, and by about 30 times by concentrating a field of the electromagnetic radiation in a waveguide. Additional gains may be obtained from using larger numbers of atoms, since a cavity where the vapor, or atoms, reside can be made long, a factor of about 30 in the electric field sensitivity. All of these features can be realized in the same photonic crystal frame, in some cases. Since these aforementioned gains are quoted in terms of the electric field sensitivity, the sensitivity improvement in terms of power, which is typically used to characterize radar receivers, increases as the square of these numbers and can be greater than $10^6$.

Figure 7:
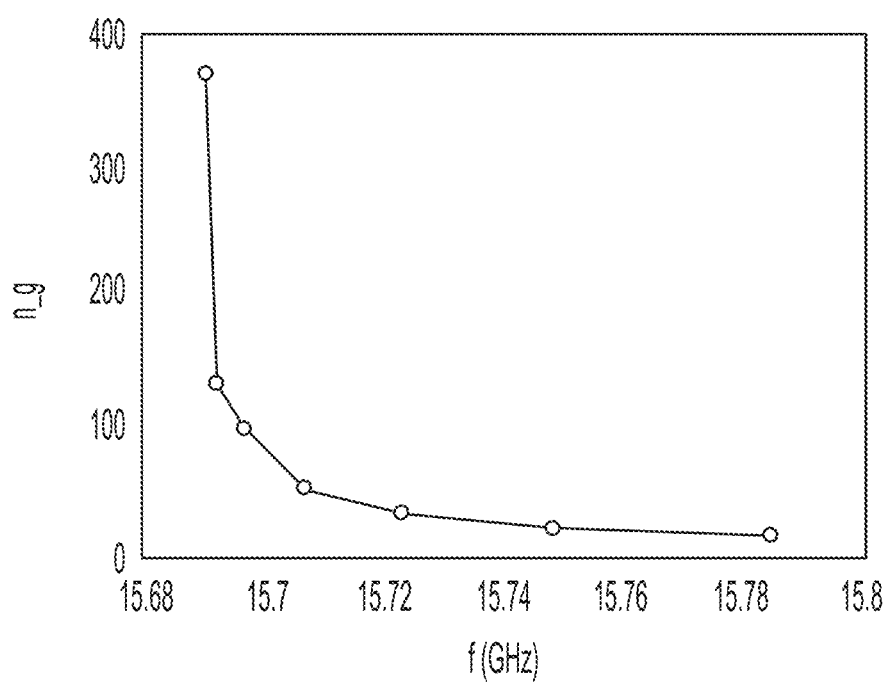
FIG. 7 is a graph of the group index of refraction ($n_g$), as a function of a frequency (f) of RF electromagnetic radiation, for the example photonic crystal receiver of FIG. 3.

For example, FIG. 7 presents a graph of the group index of refraction ($n_g$), as a function of a frequency (f) of RF electromagnetic radiation, for the example photonic crystal receiver of FIG. 3. The periodic arrangement of holes in the photonic crystal frame of the example photonic crystal receiver slows down a wave of the RF electromagnetic radiation. The velocity of the target RF electromagnetic wave is inversely proportional to $n_g$. In FIG. 7, the increase of $n_g$ is significant below about 15.75 GHz and indicates frequencies of RF electromagnetic radiation (e.g., less than about 15.75 GHz) that the photonic crystal receiver is well-suited to receive. The photonic crystal waveguide may enhance the sensitivity to the target RF electromagnetic radiation (or electric field component thereof) through field confinement in the elongated slot. The sensitivity may also be enhanced through slowing down the target RF electromagnetic wave, where $n_g=c/v_g$. Here, c is speed of light in vacuum, and $v_g$ is the group velocity of the target RF electromagnetic wave in the photonic crystal. As shown in FIG. 7, $n_g$ with values exceeding several hundred is feasible. There is a trade-off between the bandwidth of the device and the value of $n_g$. For higher $n_g$, the bandwidth is reduced. The example calculation shown in FIG. 7 shows that for $n_g$ between 100 and 130, the bandwidth of the device is about 5 MHz, well within the range used for modern radar systems and some communications systems.

Figure 8A:
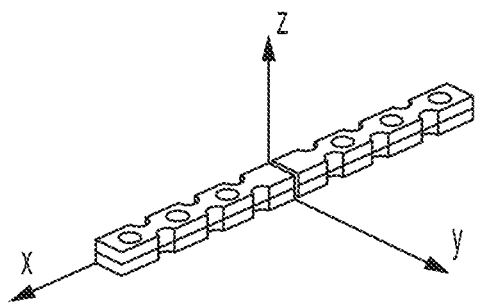
FIG. 8A is a unit cell of an example slotted photonic crystal waveguide.
Figure 8B:
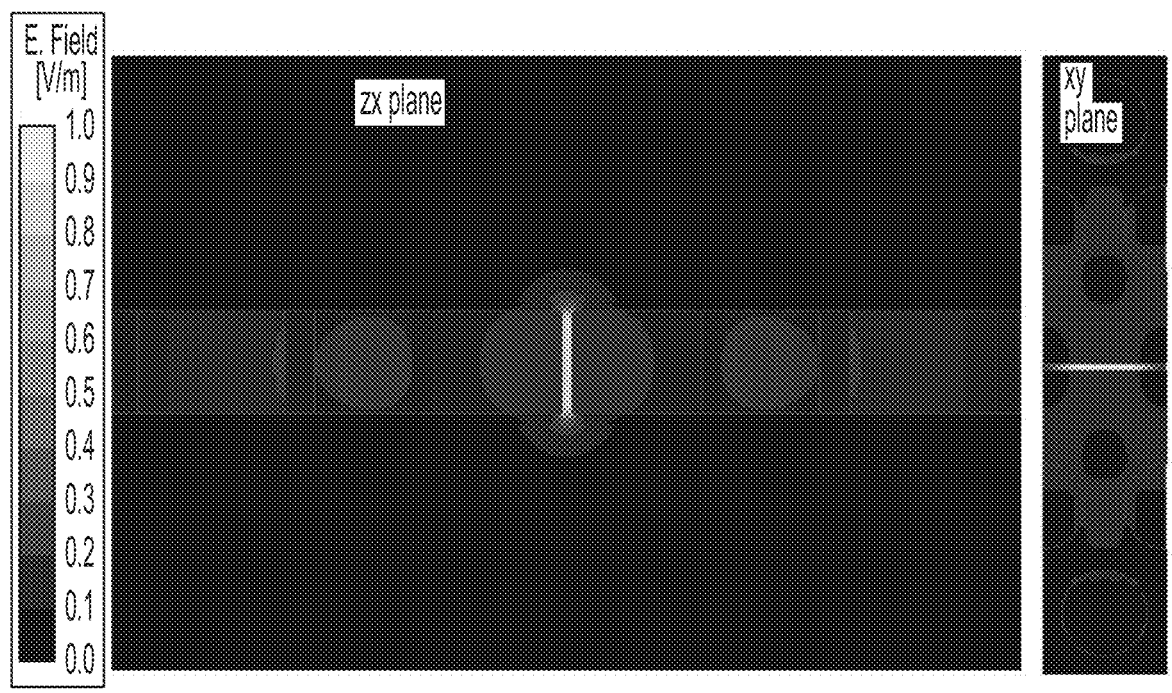
FIG. 8B is a simulation, shown by a contour graph, of an electric field in the unit cell of FIG. 8A.

FIG. 8A presents a unit cell of an example slotted photonic crystal waveguide. FIG. 8B presents a simulation, shown by a contour graph, of an electric field in the unit cell of FIG. 8A. The left contour graph corresponds to the zx plane of the unit cell, and the right contour graph corresponds to a xy plane of the unit cell. In the example shown, a single unit cell is sufficient for characterizing the example slotted photonic crystal waveguide. The contour graphs illustrate the build-up or concentration of the electric field in the linear cavity (or elongated slot) of the example slotted photonic crystal waveguide, as represented by the unit cell. The amplification of the electric field in this example is around 30 times.

Figure 9A:
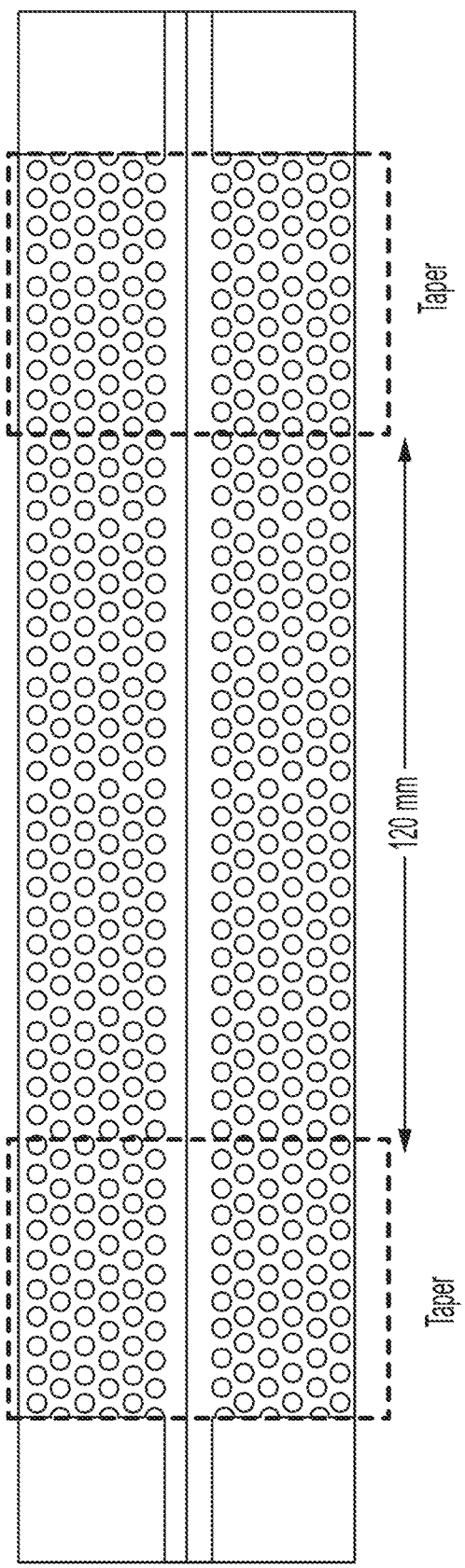
FIG. 9A is a schematic diagram of an example photonic crystal frame that includes a photonic crystal structure defined by a periodic arrangement of holes.
Figure 9B:
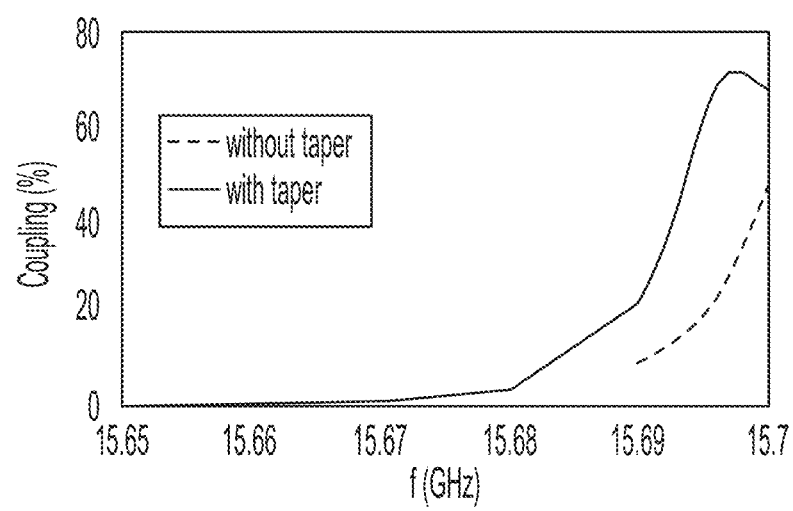
FIG. 9B is a graph showing a simulated transmission loss at a frequency of 15.697 GHz over a bandwidth of 50 MHz for a degree of tapering in the periodic arrangement of holes of FIG. 9A.

The photonic crystal receivers may include features to minimize coupling losses between the target electromagnetic radiation and the photonic crystal waveguide. For example, holes in the periodic arrangement of holes may be offset from their ideal periodic positions to adjust $n_g$. Such offset, especially adjacent a cavity or slot waveguide, may define a tapering of the holes to provide impedance-matching. FIG. 9A presents an example photonic crystal frame that includes a photonic crystal structure defined by a periodic arrangement of holes. The periodic arrangement of holes is configured to slow down electromagnetic radiation received by the example photonic crystal frame. FIG. 9B presents a graph at a frequency interval of 50 MHz, showing a simulated transmission loss for a degree of tapering in the periodic arrangement of holes of FIG. 9A. In FIG. 9A, the example photonic crystal frame is illustrated back to back in order to show the loss due to slowing down of the electromagnetic radiation (or RF wave). The photonic crystal group velocity is changed along the example photonic crystal frame to maximize the coupling into the structure, which minimizes transmission losses.

Changing the photonic crystal group velocity can be done by modifying the distance of the holes to the slot waveguide in a controlled fashion. FIG. 9B shows that the photonic crystal frame with the gradual slowing of the RF wave exhibits less than 30% loss in transmission, while the loss for the unmodified structure is much larger, around 73%. Moreover, the loss over the useful bandwidth of the photonic crystal frame with the gradual slowing of the RF wave is uniform. An example design frequency of the photonic crystal waveguide is about 15.697 GHz. Coupling of the electromagnetic radiation to the photonic crystal structure is about 30% for the entire structure. As a result, a photonic crystal receiver based on the example photonic crystal frame of FIG. 9A can reach sensitivity levels of −110 dBm for a 1 MHz bandwidth, which is competitive with current metallic receivers. Such sensitivity levels are without using a dish. The sensitivity can be further increased by using a dish (e.g., dish 202 of FIG. 2), as is done with some conventional receivers, thereby improving the sensitivity of the example photonic crystal system. For example, the photonic crystal system may include the photonic crystal receiver and the dish which function cooperatively. A 1 m$^2$ dish can improve the sensitivity of the example photonic crystal frame at about 15 GHz by almost 3 orders of magnitude. Note that the thermal noise floor is about −140 dBm for a 1 MHz bandwidth. Coherent schemes can enable the detection of signals within the thermal noise floor, but it is generally not important to exceed sensitivities much beyond the thermal noise floor.

Polarization sensitivity generally depends on the strength of the return signal and at least two limiting factors. The limiting factors include the sensitivity limit of the receiver and the rejection ratio of the photonic crystal structure for horizontal polarization versus vertical polarization. Based on the sensitivity limit of some example designs and a target return signal power of 10 μW (−20 dBm), the minimum resolvable polarization angle is approximately the smallest detectable electric field/anticipated electric field to be detected ~$10^{-4}$ rad ~0.006 degrees of rotation. The rejection ratio between horizontal and vertical polarizations for the photonic crystal receiver shown in FIGS. 1 and 3 may be about $10^{-3}$ rad ~0.06 degrees. However, although not shown in FIGS. 1 and 3, other configurations of the photonic crystal receiver include polarizers that can be added to a protrusion (or taper) from the photonic crystal frame (e.g., the periodic array of segments illustrated by FIG. 4). These polarizers can further increase the polarization selectivity by 3-4 orders of magnitude. Angular resolutions of <0.05 degrees can be achieved. These performance metrics are calculated without a dish, which can further amplify the signals and increase the polarization discrimination. Moreover, the vapor can also be used to discriminate polarization.

In some cases, the photonic crystal receivers may be paired with stable laser systems to realize a field-deployable unit. In some implementations, the photonic crystal receiver is optically coupled to a set of lasers tuned to fixed transitions of the vapor (e.g., a vapor of Cs atoms). For example, a photonic crystal receiver may be optically coupled to a distributed Bragg reflector (DBR) laser capable of emitting a 852-nm photon beam and a single pass doubled fiber laser capable of emitting a photon beam of about 510 nm in wavelength. The 510-nm wavelength is well-suited to interact with a vapor of cesium atoms. It is also possible to use a DBR or distributed feedback (DFB) laser that operates at 510 nm. A DBR or laser at 510 nm can decrease the size of the receiver system, increase stability, and reduce the power required to operate the receiver system. In some variations, a Fabry-Perot laser can be built as a filter cavity laser system at 510 nm. The Fabry-Perot filter cavity laser that we have constructed can provide up to 100 mW of power. The filter cavity laser has many of the advantages of a DBR or DFB laser (e.g., the reduction in the power required to run the receiver system). However, unlike a DBR or DFB laser, the filter cavity laser is typically not hermetically sealed during production and contains free-space optics. In some variations, the entire optical circuit of the photonic crystal receiver can be a fiber optic assembly.

Light can be coupled into the cavity of the photonic crystal receiver in several different ways. In some instances, the light can be coupled into the cavity on the non-tapered side through an optical window, such as shown in FIGS. 1A-1B. A fiber and lens assembly can also be fused to the silicon frame (e.g., as shown in FIGS. 5A-5E). Light can also be coupled in from the side of the structure using small mirrors on a groove assembly, such as shown in FIG. 6. Small 45-degree mirrors can be placed in the RF waveguide and aligned with a side coupling assembly (e.g., as shown in FIGS. 5C-5E). All of these configurations can also be used to optically couple the probe light to the cavity or RF waveguide, which measures the transparency of the cesium gas. Filters may be used to eliminate unwanted light. In some applications, it may be advantageous to retroreflect the light back down the slot so that the out-coupled probe light returns along the in-coupling path (e.g., as shown in FIGS. 5B and 5E).

One of the challenges of making photonic crystal receivers is the accuracy needed to machine the photonic crystal structures. Laser machining may be used to build components of the photonic crystal receivers at accuracies of 2 μm. Feature sizes may be as small as 10 μm. These dimensions are small enough to machine the components needed to construct the receiver, 1 part in $10^4$ of the wavelength for 15 GHz. A photonic crystal receiver scales with wavelength, and the receiver can be scaled to other electromagnetic frequencies. The photonic crystal receiver may be constructed by machining a frame from a dielectric material, such as silicon, and bonding optical windows to the frame after the slot has been filled with cesium vapor. The cesium vapor may be filled from a background vapor, depositing a paraffin coated drop of cesium in the vapor cell, or using a laser activated getter material (SAES). In some manufacturing methods, a first optical window is bonded to the frame using anodic bonding. The frame is made of silicon. A second optical window is then contact bonded to the frame. However, in some variations, the second window is anodically bonded to the frame as well, as long as a fill hole is left open for introducing the vapor (e.g., a vapor of cesium atoms) into the cavity where the atoms reside. The fill hole can be sealed using a contact bond. Contact bonds are used for the last seal because other bonding methods (e.g., anodic bonding) require high temperatures and voltages, which lead to outgassing of contaminate species. Rydberg atom electrometry exhibits high performance when the background gas density is small, such as around <$10^{-3}$ Torr since spectral broadening of Rydberg states is ~200 MHz Torr$^{-1}$ for Nz. Other frame materials with high dielectric constants can also be used, such as BLT. Adhesion layers may be used with silicon or the other frame materials. Low loss materials at the operational frequency are also desirable. The holes needed for the photonic crystal frame can be cut straight through the glass and frame in a final step instead of cut through only the frame.

Figure 10A:
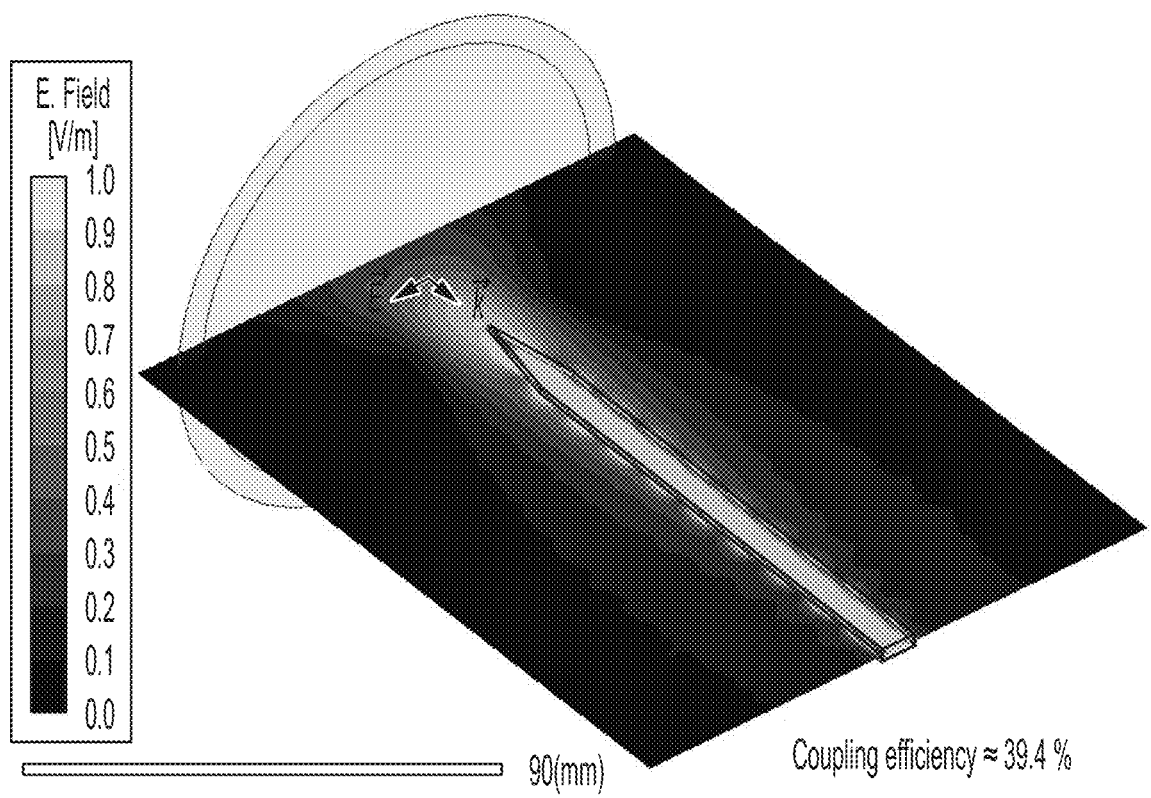
FIG. 10A is a contour graph of a simulated coupling of a 15.697 GHz electromagnetic wave to an example tapered waveguide using a parabolic dish.
Figure 10B:
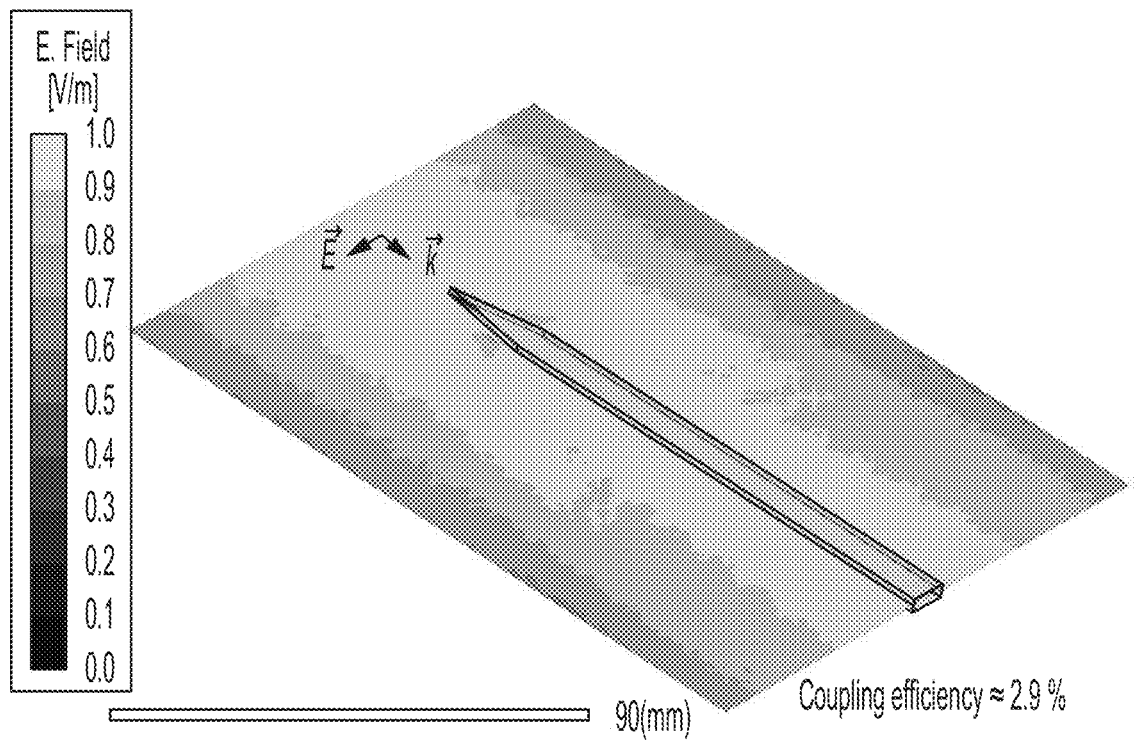
FIG. 10B is a contour graph of a simulated coupling of the 15.697 GHz electromagnetic wave of FIG. 10A to the example tapered waveguide, but in the absence of the parabolic dish and received as a plane wave.

As described in relation to FIGS. 1A-1B, a dish can increase the sensitivity of a photonic crystal receiver. FIG. 10A presents a contour graph of a simulated coupling of a 15.697 GHz electromagnetic wave to an example tapered waveguide using a parabolic dish. The dish can enhance the coupling by orders of magnitude compared to a plane wave. The focused Gaussian beam couples to the example tapered waveguide better and the dish captures a larger fraction of the incident plane wave. The example photonic crystal receiver may be configured similar to the example photonic crystal receiver described in relation to FIGS. 1A-1B. FIG. 10B presents a contour graph of a simulated coupling of the 15.697 GHz electromagnetic wave of FIG. 10A to the example tapered waveguide, but in the absence of the parabolic dish and received as a plane wave. The 15.697 GHz electromagnetic wave (or signal) is directed along a length of the linear cavity (or waveguide). A Gaussian focal spot is not optimized for the photonic crystal receiver. Optimization of the focal spot size can further increase the coupling of the target electromagnetic field intercepted by the dish into the photonic crystal receiver.

Figure 11A:
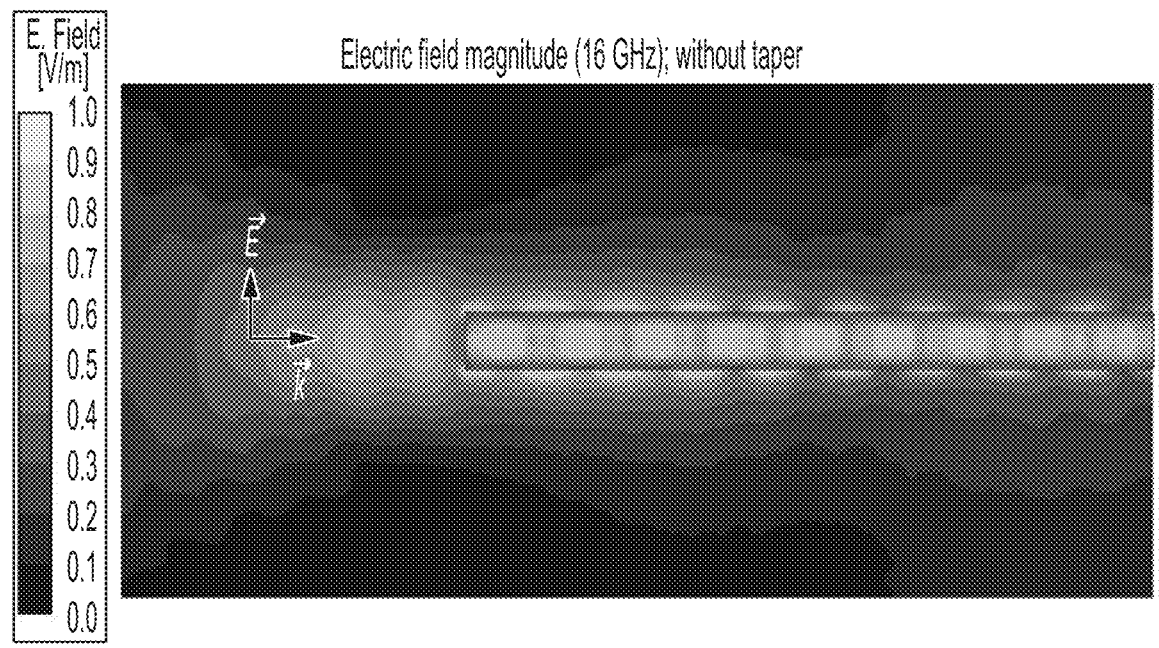
FIG. 11A is a simulated coupling efficiency of an incoming RF electromagnetic wave to an example non-tapered waveguide where the incoming RF electromagnetic wave is modeled as a Gaussian beam.
Figure 11A:
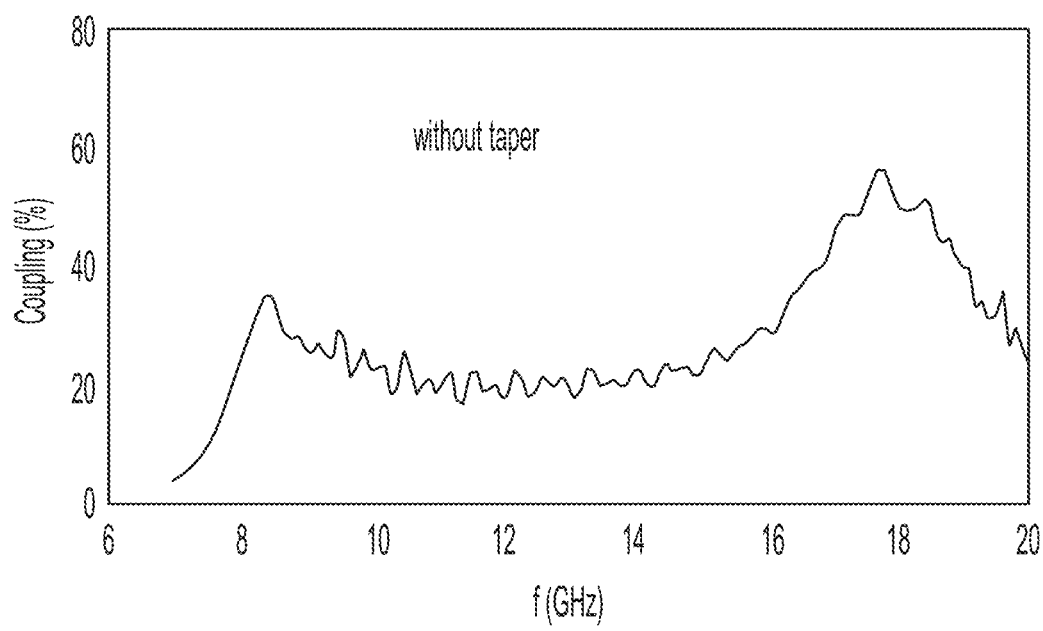
Figure 11B:
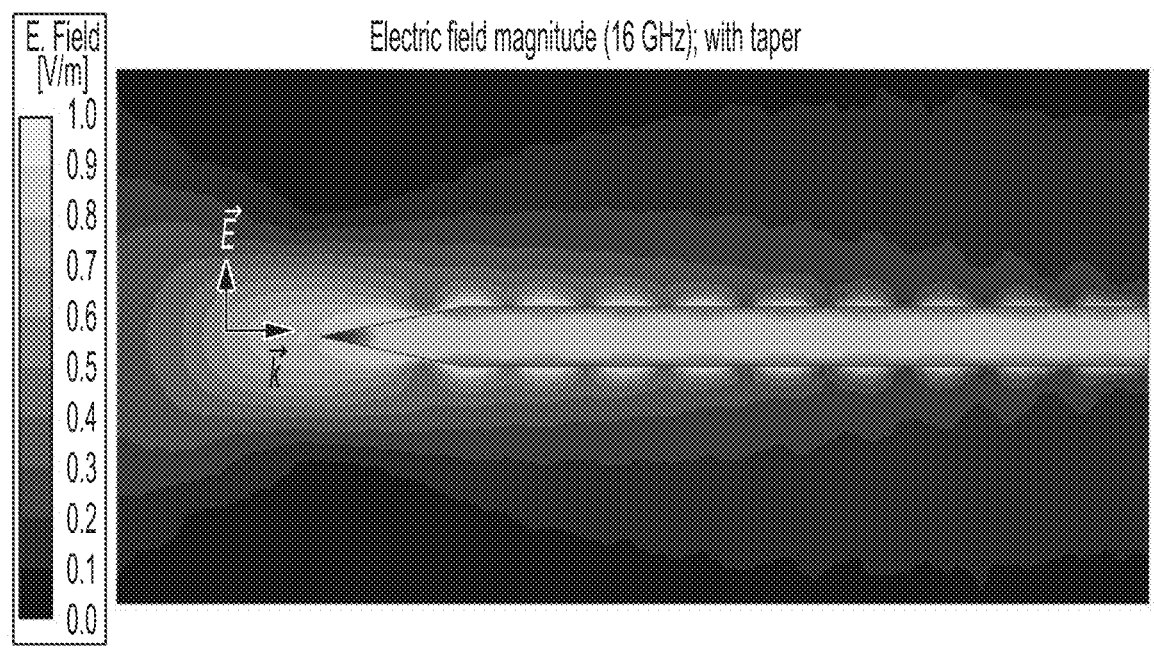
FIG. 11B is a simulated coupling efficiency of an incoming RF electromagnetic wave to an example tapered waveguide where the incoming RF electromagnetic wave is modeled as a Gaussian beam.
Figure 11B:
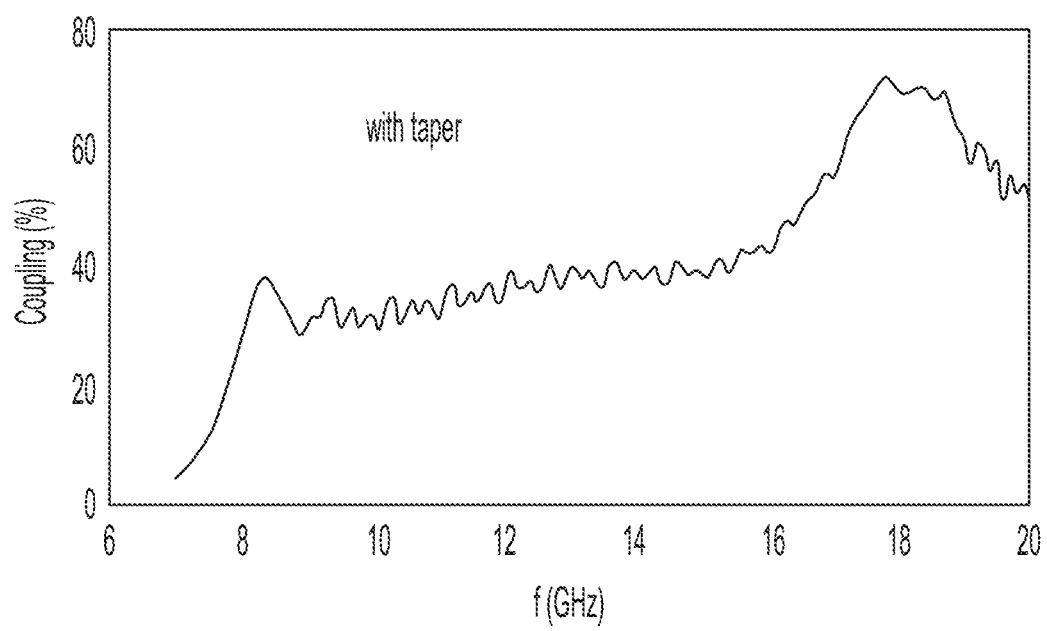

FIGS. 11A-11B present a simulated coupling efficiency of an incoming RF electromagnetic wave at 20 GHz to example waveguides (e.g., tapered vs. non-tapered). The example waveguides include a photonic crystal frame with an elongated slot and a periodic arrangement of holes therein. The contour graphs of FIGS. 11A-11B show an electric field strength of the incoming RF electromagnetic wave in a region that includes the waveguides. The contour graph of FIG. 11A is simulated with no taper in the waveguide, while the contour graph of FIG. 11B is simulated with a taper in the waveguide. Black lines in the contour graphs outline the waveguides, especially along the elongated slot. In FIG. 11B, the concentrated portion extends past an end of the waveguide into a triangular region.

The graphs of the coupling efficiency vs. frequency (i.e., lower half of FIGS. 11A-11B) show that the taper doubles the coupling efficiency over a majority of the frequency range, which is plotted from 13 GHz to 20 GHz. The incoming RF electromagnetic wave is modeled as a Gaussian beam, and the example photonic crystal receiver may be configured similar to the example photonic crystal receiver of FIGS. 1A-1B. The assumption of a Gaussian beam is consistent with the situation depicted in FIG. 2. In FIG. 2, the dish captures a return signal, which is nominally a plane wave at the position of the photonic crystal receiver since the target is far away. The parabolic shape allows the dish to focus the plane wave into the photonic crystal receiver. In receiving applications, such as for radar systems, it is typical that the source of the scattered RF electromagnetic field is very far from receiver, so the incoming RF field is a plane wave.

Figure 12A:
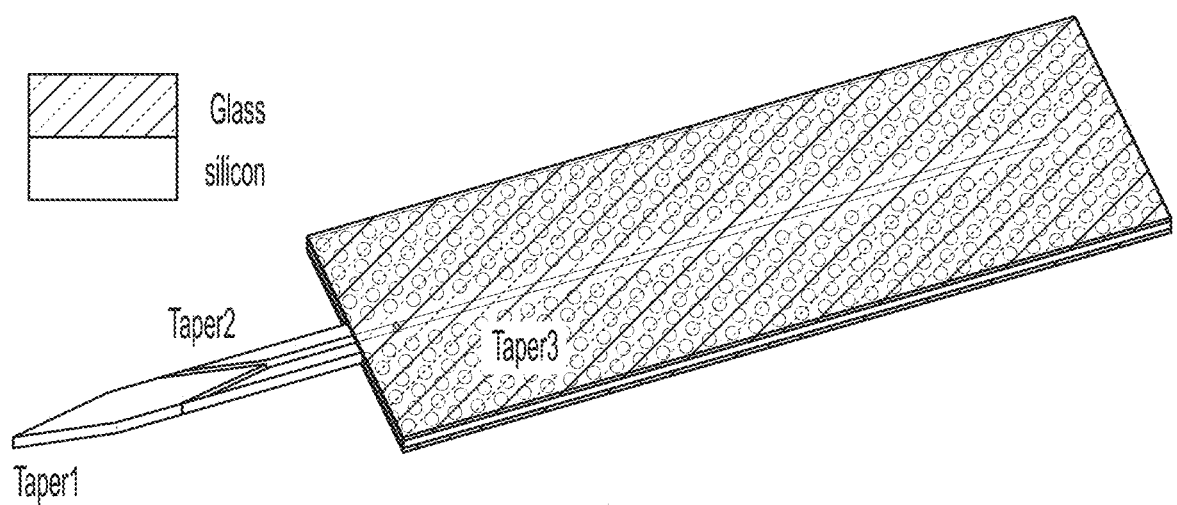
FIG. 12A is a schematic diagram, in perspective, of an example photonic crystal receiver having three tapers in a photonic crystal frame.

Now referring to FIG. 12A, a schematic diagram is presented, in perspective, of an example photonic crystal receiver having three tapers in a photonic crystal frame. A first taper and a second taper are associated with a protrusion from the photonic crystal frame. The first taper may define a transition for an electromagnetic wave from free space into a body of the photonic crystal frame. The second taper may improve the coupling of the electromagnetic wave into the waveguide in the photonic crystal frame. A third taper is associated with a spacing of the periodic arrangement of holes, such as described in relation to FIGS. 9A-9B and 11A-11B. The third taper helps to increase the coupling of the target electromagnetic wave into the slow wave structure, thereby reducing loss. The spacing of the periodic arrangement of holes may be represented by an inter-hole distance (or lattice constant), a, and a hole diameter, d. Example inter-hole distances and hole diameters for a silicon frame at various electromagnetic frequencies are presented below in Table 1. A height of the photonic crystal frame, which is formed of silicon, matches the hole diameter, d, for each frequency. However, heights that differ from the hole diameter are possible.

TABLE 1

| Frequency | a (lattice constant) | d (hole diameter) | $h_{silicon}$ |
|---|---|---|---|
| 5 GHz | 15 mm | 9 mm | 9 mm |
| 15 GHz | 5 mm | 3 mm | 3 mm |
| 20 GHz | 3.75 mm | 2.25 mm | 2.25 mm |
| 40 GHz | 1.9 mm | 1.1 mm | 1.1 mm |
| 80 GHz | 0.95 mm | 0.6 mm | 0.6 mm |

Figure 12B:
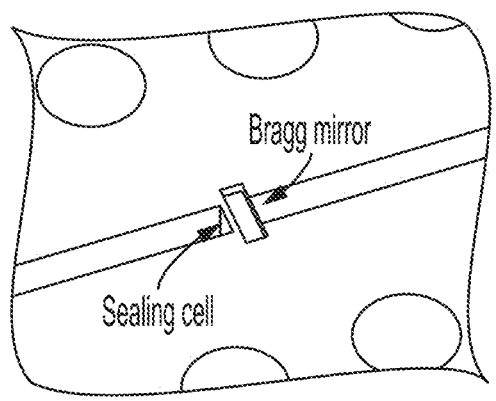
FIG. 12B is a detail view of a cavity portion of the example photonic crystal receiver of FIG. 12A.
Figure 12C:
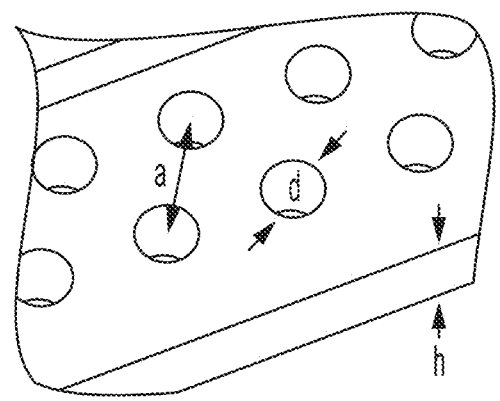
FIG. 12C is a detail view of a portion of a periodic arrangement of holes in the photonic crystal frame of the example photonic crystal receiver of FIG. 12A.

FIG. 12B presents a detail view of a cavity portion of the example photonic crystal receiver of FIG. 12A. The cavity portion includes a reflective mirror (e.g., a Bragg mirror) in a linear cavity. FIG. 12C presents a detail view of a portion of a periodic arrangement of holes in the photonic crystal frame of the example photonic crystal receiver of FIG. 12A. The spacing of the periodic arrangement of holes is shown in FIG. 12C, which illustrates the inter-hole distance (or lattice constant), a, the hole diameter, d, and the height of the photonic crystal frame, h.

Figure 13A:
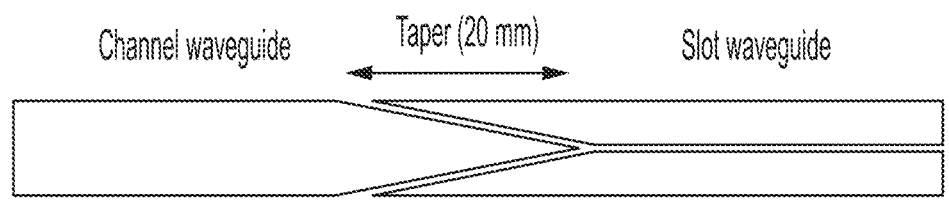
FIG. 13A is a detailed view, from a top-down perspective, of the second taper of FIG. 12A.
Figure 13B:
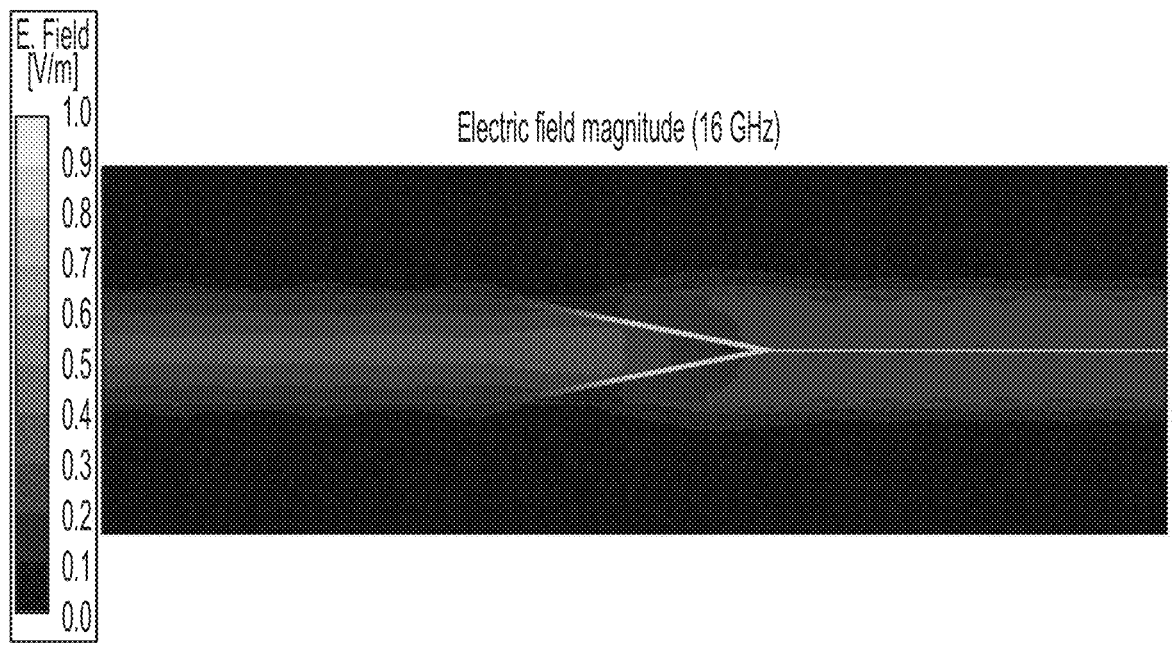
FIG. 13B is a contour map showing a simulated electric field strength of electromagnetic radiation leaving the second taper of FIG. 12A to enter a slot waveguide.
Figure 13C:
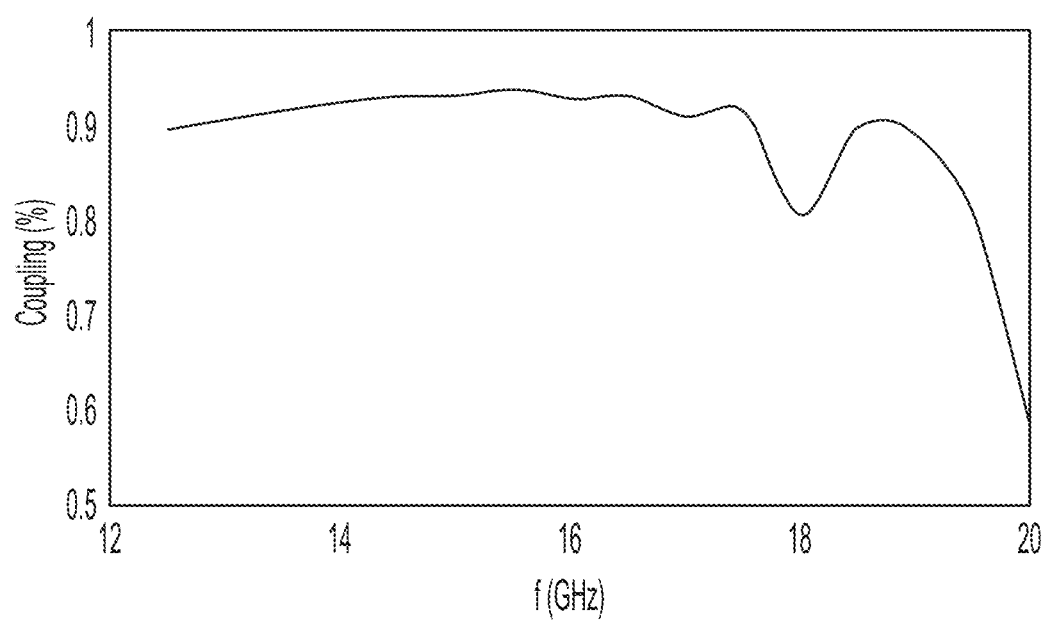
FIG. 13C is graph showing a simulated transmission loss when traversing the second taper of FIG. 12A from a channel to a slot waveguide.

FIG. 13A presents a detailed view, from a top-down perspective, of the second taper of FIG. 12A. The second taper may be operable to couple the channel waveguide to the slot waveguide. The coupling loss is less than 0.35 dB for a frequency range of 15 GHz to 16 GHz frequency range, as shown by FIGS. 13B & 13C. The coupling can be better than 92%. The dimensions of the photonic crystal, namely, d, the diameter of the holes, a, the periodicity or lattice constant of the holes, and, h, the thickness of silicon frame for a particular photonic crystal receiver are functions of a target RF electromagnetic field frequency. In order for the photonic crystal receiver to slow the target RF electromagnetic field in the line-defect region, the photonic crystal should have a bandgap near the desired design frequency. The device uses the dispersion that occurs near a photonic resonance that is designed into the photonic crystal by choosing the hole spacing, device thickness, and hole diameter. Other shapes of holes and parameters are possible. Table 1 provides representative design values for a silicon frame for these parameters for several frequencies.

Figure 14:
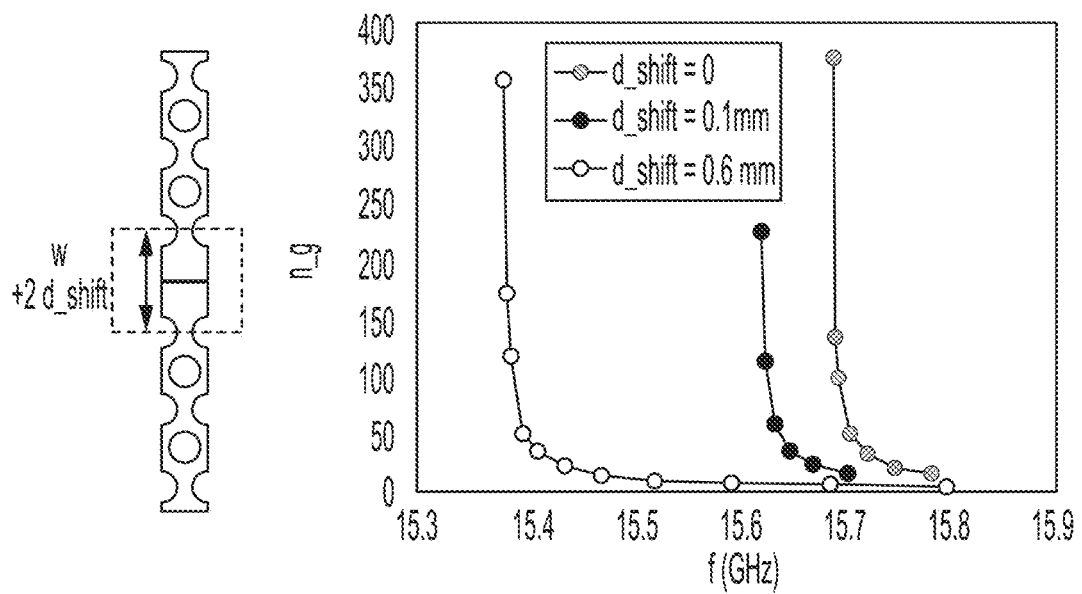
FIG. 14 is a schematic diagram of a section of an example photonic crystal frame and a graph showing a relationship between a group index of refraction ($n_g$) of the example photonic crystal frame versus a frequency (f) of RF electromagnetic radiation for various magnitudes of hole offsets.

For efficient coupling to the photonic crystal waveguide, a tapering in group index, $n_g$, is needed. As shown in FIG. 14, shifting (or tapering) the rows of holes adjacent to the slot region so that they are nearer or farther from each other can change $n_g$. With such a configuration, the coupling efficiency is about 72% into the slot waveguide, including all tapers, at 15.697 GHz. The shifting (or tapering) of the holes via hole offsets may be used to slow an electromagnetic wave down in a controlled manner so that the wave couples into the photonic crystal waveguide more efficiently.

Laser light to prepare and read-out the atoms can be coupled into and out of the photonic crystal receiver through free space, or through fiber coupling of the light to the photonic crystal frame. In some variations, the photonic crystal frame can include a mirror, such as Bragg mirror, at one end of the slot to direct laser beams down the slot so as to interact with the vapor. A mirror can be located at the other end of the channel as well. This additional mirror can be used to reflect the laser beams back along the channel where they can be separated by filters and beam splitters (e.g. a fiber beam splitter or circulator). The additional mirror can also be used to reflect the light from one or more of the lasers so as to couple it out of the device, such as shown in FIG. 6. The mirrors can be designed as filters to separate the different colors of light. It is also possible that there is a fiber coupler at both ends of the slot. In this case, the light is coupled into the guide at one end and received at the other end, without using mirrors in the slot. After the probe laser light—referring to Rydberg atom-based sensing configurations—leaves the channel, the probe laser light is transported to a photodetector and its optical signal processed to readout the strength, polarization, and phase of the incoming RF electromagnetic field as a function of time. Other parameters are possible.

Figure 15:
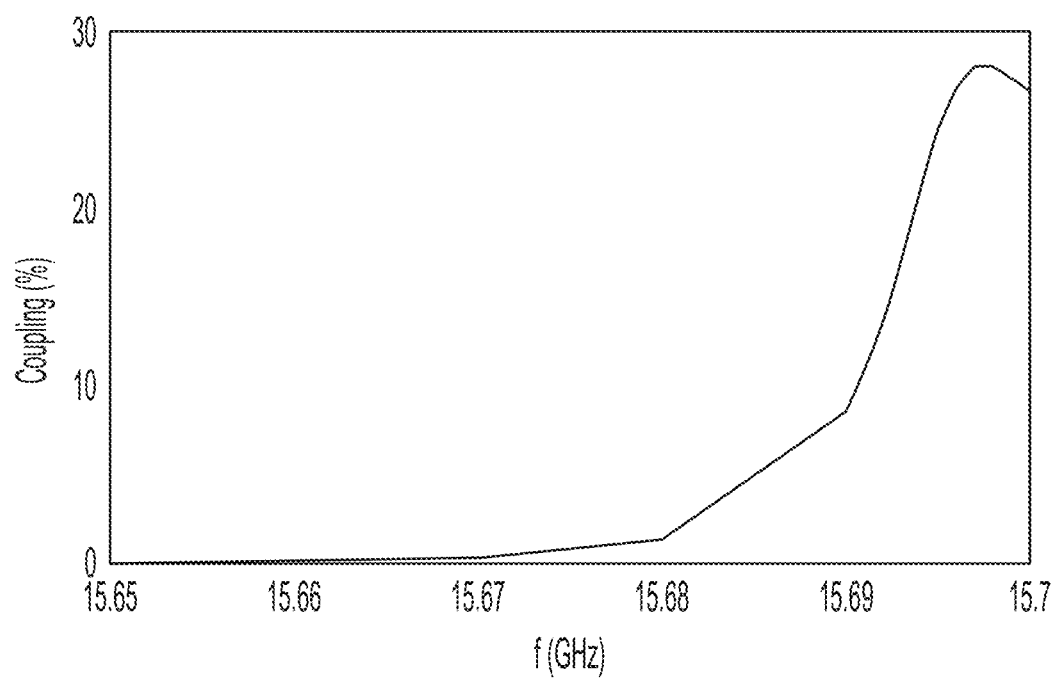
FIG. 15 is a graph of a simulated total coupling efficiency for the example photonic crystal receiver of FIG. 12A.

Now referring to FIG. 15, a graph is presented of a simulated total coupling efficiency for the example photonic crystal receiver of FIG. 12A. The ordinate of the graph shows a total coupling efficiency in percent and the abscissa of the graph shows a frequency of incoming RF electromagnetic radiation received by the example photonic crystal receiver. The total coupling efficiency represents the contribution of three tapers to the operation of the photonic crystal receiver, i.e., the first, second, and third tapers shown in FIG. 12A. The total coupling efficiency increases notably above 15.68 GHz, peaking at approximately 15.697 GHz.

Figure 16:
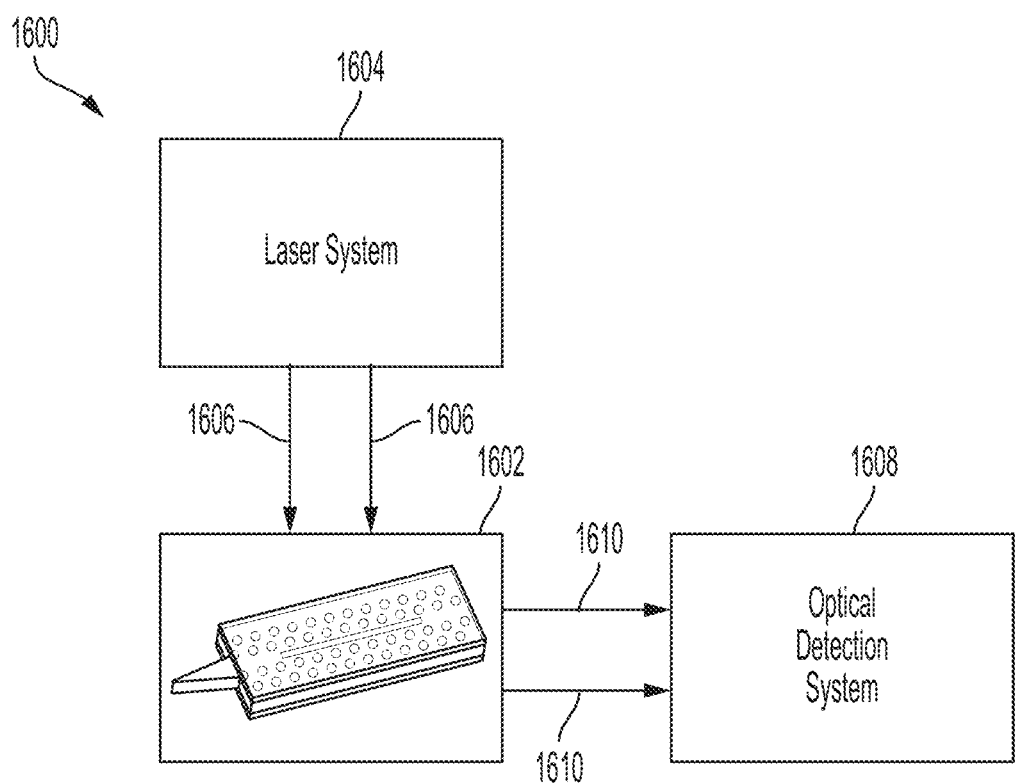
FIG. 16 is a block diagram of an example system for sensing radio frequency (RF) electromagnetic radiation.

Now referring to FIG. 16, a block diagram is presented of an example system 1600 for sensing RF electromagnetic radiation. The example system 1600 includes a receiver 1602 formed of dielectric material that includes a photonic crystal structure having an elongated slot disposed therein. The receiver 1602 may be analogous to the photonic crystal receivers described in relation to FIGS. 1A-15. The receiver 1602 also includes an antenna structure extending from the photonic crystal structure and configured to couple to a target RF electromagnetic radiation having a frequency in a range from 100 MHz-1 THz. The receiver 1602 additionally includes a vapor or a source of the vapor in the elongated slot.

The example system 1600 also includes a laser system 1604 configured to provide input optical signals 1606 to the elongated slot that interact with one or more electronic transitions of the vapor. The input optical signals 1608 may have respective frequencies matched to energy differences associated with the one or more electronic transitions. For example, the input optical signals 1608 may include a probe laser beam and a coupling laser beam matched, respectively, to first and second electronic transitions of the vapor. In some implementations, a fiber optic assembly optically couples the laser system 1604 to the receiver 1602. In these implementations, the fiber optic assembly is operable to convey the input optical signals 1606 from the laser system 1604 to the receiver 1602. During operation, the input optical signals 1608 pass through the elongated slot to interact with the vapor and then exit the elongated slot as output optical signals 1610.

The example system 1600 additionally includes an optical detection system 1608 configured to detect the target RF electromagnetic radiation based on the output optical signals 1610 from the elongated slot. The optical detection system 1608 may be configured to detect a property of the target RF electromagnetic radiation based on the output optical signals 1610. Examples of the property include an electric field magnitude, a phase, a polarization, and a frequency. Combinations of these properties may also be detected by the optical detection system 1608. In some implementations, a fiber optic assembly optically couples the receiver 1602 to the optical detection system 1608. In these implementations, the fiber optic assembly is operable to convey the output optical signals 1610 from the receiver 1602 to the optical detection system 1608.

In some implementations, the example system 1600 includes a dish configured to focus the target RF electromagnetic radiation to a focal point, such as described in relation to FIG. 2. In these implementations, the antenna structure may include a tapered end near the focal point. In further implementations, the example system 100 includes a phase-stable source of electromagnetic radiation (e.g., a reference antenna) configured to generate a reference electromagnetic radiation having a frequency at or near a frequency of the target RF electromagnetic radiation. In such implementations, the dish may include a focusing element at an apex of the dish configured to direct the reference electromagnetic radiation onto the receiver 1602.

In operation, the example system 1600 receives RF electromagnetic radiation at the receiver 1602, which is formed of dielectric material. The example system 1600 also generates, by operation of the laser system 1604, the input optical signals 1606, which are adapted to interact with electronic transitions of the vapor. The example system 1600 additionally passes the input optical signals 1606 through the vapor in the elongated slot thereby producing one or more output optical signals 1610. The example system 1600 then determines, by operation of the optical detection system 1608, a property of the received RF electromagnetic radiation by measuring a property of the one or more output optical signals. The determined property may be an electric field magnitude, a phase, a polarization, or a frequency of the received RF electromagnetic radiation (including any combination thereof). The measured property may be an electric field magnitude, a phase, a polarization, or a frequency of the one or more output optical signals (including any combination thereof).

In some implementations, receiving RF electromagnetic radiation includes focusing, by operation of a dish, the received RF electromagnetic radiation on the antenna structure. In some implementations, the example system 1600 includes a phase-stable source of electromagnetic radiation, such as a reference antenna. In these implementations, the example system 1600 may generate, by operation of the phase-stable source of electromagnetic radiation, a reference electromagnetic radiation having a frequency at or near a frequency of the target RF electromagnetic radiation. The example system 1600 may also direct the reference electromagnetic radiation towards the receiver 1602 using a focusing element disposed at an apex of the dish, as shown in FIG. 2.

In some aspects of what is described, a receiver (or photonic crystal receiver) for sensing RF electromagnetic radiation may be described by the following examples:

Example 1. A receiver for sensing radio frequency (RF) electromagnetic radiation, the receiver comprising:
   a dielectric body comprising:
      an array of cavities ordered periodically to define a photonic crystal structure in the dielectric body,
      a region in the array of cavities defining a defect in the photonic crystal structure, and
      an elongated slot through the region extending from a slot opening in a surface of the dielectric body at least partially through the dielectric body;
   a vapor or a source of the vapor in the elongated slot; and an optical window covering the elongated slot and having a window surface bonded to the surface of the dielectric body to form a seal about the slot opening.

Example 2. The receiver of example 1, wherein the photonic crystal structure is configured to decrease a group velocity of a target RF electromagnetic radiation having a frequency in a range from 100 MHz-1 THz.

Example 3. The receiver of example 1 or example 2, wherein the photonic crystal structure is configured to concentrate a target RF electromagnetic radiation in the elongated slot, the target RF electromagnetic radiation having a frequency in a range from 100 MHz-1 THz.

Example 4. The receiver of example 1 or any one of examples 2-3, wherein the array of cavities comprises one or more offset cavities that are spatially offset from an ideal periodic position in the array.

Example 5. The receiver of example 4, wherein the one or more offset cavities reside nearest an end of the elongated slot and have respective spatial offsets away from the end of the elongated slot.

Example 6. The receiver of example 4, wherein the one or more offset cavities reside nearest a side of the elongated slot and have respective spatial offsets away from the side of the elongated slot.

Example 7. The receiver of example 1 or any one of examples 2-6, comprising a mirror disposed at an end of the elongated slot.

Example 8. The receiver of example 7, wherein the mirror is angled relative to an optical pathway defined by the elongated slot.

Example 9. The receiver of example 7, wherein the mirror is perpendicular to an optical pathway defined by the elongated slot.

Example 10. The receiver of example 1 or any one of examples 2-9, wherein the dielectric body comprises an antenna structure extending from an end of the dielectric body and aligned with the elongated slot.

Example 11. The receiver of example 10, wherein the antenna structure is configured to couple to a target RF electromagnetic radiation having a frequency in a range from 100 MHz-1 THz.

Example 12. The receiver of example 10 or example 11, wherein the antenna structure comprises:
a narrow portion aligned with the elongated slot; and
an array of co-planar segments extending outward from the narrow portion and having a periodic spacing therealong.

Example 13. The receiver of example 10 or any one of examples 11-12, wherein the antenna structure comprises one or more channels defining a taper internal to the antenna structure, the taper configured to couple electromagnetic radiation received by the antenna structure to the elongated slot.

Example 14. The receiver of example 1 or any one of examples 2-13, wherein the photonic crystal structure defines a photonic band gap associated with a transverse magnetic (TM) mode of RF electromagnetic radiation.

Example 15. The receiver of example 1 or any one of examples 2-14, wherein the photonic crystal structure defines a photonic band gap associated with a transverse electric (TE) mode of RF electromagnetic radiation.

Example 16. The receiver of example 1 or any one of examples 2-15, wherein the vapor comprises a gas of alkali-metal atoms.

Example 17. The receiver of example 1 or any one of examples 2-16,
wherein the surface of the dielectric body defines a cavity opening for each of the array of cavities;
wherein the optical window covers each of the cavity openings; and
wherein the window surface forms a seal about each of the cavity openings.

Example 18. The receiver of example 1 or any one of examples 2-17,
wherein the surface of the dielectric body is a first surface and the dielectric body comprises a second surface opposite the first surface;
wherein the elongated slot extends through the dielectric body from the first surface to the second surface;
wherein the slot opening is a first slot opening and the second surface of the dielectric body defines a second slot opening of the elongated slot;
wherein the optical window is a first optical window and the window surface is a first window surface; and
wherein the receiver comprises a second optical window covering the second slot opening and having a second window surface bonded to the second surface to form a seal about the second slot opening.

Example 19. The receiver of example 18,
wherein the array of cavities extends through the dielectric body from the first surface to the second surface;
wherein the first and second surfaces of the dielectric body define, respectively, first and second cavity openings for each of the array of cavities;
wherein the second optical window covers, respectively, each of the second cavity openings; and
wherein the second window surface forms a seal about each of the second cavity openings.

In some aspects of what is described, a method for sensing RF electromagnetic radiation may be described by the following examples:

Example 1. A method for sensing radio frequency (RF) electromagnetic radiation, the method comprising:
receiving RF electromagnetic radiation at an antenna structure of a dielectric body, the dielectric body comprising:
the antenna structure, configured to couple to a target RF electromagnetic radiation having a frequency in a range from 100 MHz-1 THz,
an array of cavities ordered periodically to define a photonic crystal structure in the dielectric body,
a region in the array of cavities defining a defect in the photonic crystal structure, and
an elongated slot through the region extending from a slot opening in a surface of the dielectric body at least partially through the dielectric body;
interacting the received RF electromagnetic radiation with the photonic crystal structure; and
passing input optical signals through a vapor in the elongated slot to generate one or more output optical signals.

Example 2. The method of example 1, comprising:
coupling the received RF electromagnetic radiation to the elongated slot using a taper internal to the antenna structure.

Example 3. The method of example 2,
wherein the taper is defined by one or more channels in the antenna structure; and
wherein the taper has an apex aligned with the elongated slot.

Example 4. The method of example 1 or any one of examples 2-3, wherein the region in the array of cavities extends along an axis and the elongated slot is aligned parallel to the axis; and wherein interacting the received RF electromagnetic radiation comprises decreasing a group velocity of the received RF electromagnetic radiation along a direction parallel to the axis.

Example 5. The method of example 1 or any one of examples 2-4, wherein interacting the received RF electromagnetic radiation comprises concentrating the received RF electromagnetic radiation in the elongated slot.

Example 6. The method of example 1 or any one of examples 2-5,
wherein the array of cavities comprises one or more offset cavities that are spatially offset from an ideal periodic position in the array, the offset cavities defining a photonic crystal mirror; and
wherein interacting the received RF electromagnetic radiation comprises reflecting the received RF electromagnetic radiation off the photonic crystal mirror.

Example 7. The method of example 1 or any one of examples 2-6, wherein passing input optical signals comprises reflecting the input optical signals off a mirror disposed at an end of the elongated slot.

Example 8. The method of example 1 or any one of examples 2-7, wherein receiving RF electromagnetic radiation comprises filtering a polarization of the received RF electromagnetic radiation using a polarizer integral to the antenna structure.

Example 9. The method of example 8, wherein the polarizer comprises:
a narrow portion of the antenna structure aligned with the elongated slot; and
an array of co-planar segments extending outward from the narrow portion and having a periodic spacing therealong.

Example 10. The method of example 1 or any one of examples 2-9, wherein passing the input optical signals comprises propagating the input optical signals along an optical pathway defined by the elongated slot.

Example 11. The method of example 1 or any one of examples 2-10, wherein the vapor comprises a gas of alkali-metal atoms.

In some aspects of what is described, a system for sensing RF electromagnetic radiation may be described by the following examples:

Example 1. A system for sensing radio frequency (RF) electromagnetic radiation, the system comprising:
a receiver formed of dielectric material and comprising:
a photonic crystal structure having an elongated slot disposed therein,
an antenna structure extending from the photonic crystal structure and configured to couple to a target RF electromagnetic radiation having a frequency in a range from 100 MHz-1 THz, and
a vapor or source of the vapor in the elongated slot;
a laser system configured to provide input optical signals to the elongated slot that interact with one or more electronic transitions of the vapor; and
an optical detection system configured to detect the target RF electromagnetic radiation based on output optical signals from the elongated slot.

Example 2. The system of example 1, wherein the photonic crystal structure is configured to reduce a group velocity of the target RF electromagnetic radiation.

Example 3. The system of example 1 or example 2, wherein the photonic crystal structure is configured to concentrate the target RF electromagnetic radiation in the elongated slot.

Example 4. The system of example 1 or any one of examples 2-3, wherein the photonic crystal structure comprises an array of cavities ordered periodically and at least partially surrounding the elongated slot.

Example 5. The photonic crystal receiver of example 4, wherein the array of cavities comprises one or more offset cavities that are spatially offset from an ideal periodic position in the array.

Example 6. The system of example 1 or any one of examples 2-5, wherein the antenna structure comprises:
a tapered end; and
one or more channels defining an internal taper between the tapered end and the photonic crystal structure.

Example 7. The system of example 1 or any one of examples 2-6, wherein the antenna structure comprises:
a tapered end; and
a polarizer between the tapered end and the photonic crystal structure, the polarizer configured to filter a polarization of the target RF electromagnetic radiation.

Example 8. The system of example 1 or any one of examples 2-7,
wherein the system comprises a dish configured to focus the target RF electromagnetic radiation to a focal point; and
wherein the antenna structure comprises a tapered end at or near the focal point.

Example 9. The system of example 8,
wherein the system comprises a phase-stable source of electromagnetic radiation configured to generate a reference electromagnetic radiation having a frequency at or near a frequency of the target RF electromagnetic radiation; and
wherein the dish comprises a focusing element at an apex of the dish configured to direct the reference electromagnetic radiation onto the receiver.

Example 10. The system of example 1 or any one of examples 2-9, wherein the laser system comprises a fiber optic assembly coupled to an end of the elongated slot and configured to guide the input optical signals into the elongated slot through the end.

Example 11. The system of example 1 or any one of examples 2-10, wherein the optical detection system comprises a fiber optic assembly coupled to an end of the elongated slot and configured to receive the output optical signal from the elongated slot through the end.

Example 12. The system of example 1 or any one of examples 2-11, wherein the optical detection system is configured to detect an electric field magnitude of the target RF electromagnetic radiation based on the output optical signals from the elongated slot.

Example 13. The system of example 1 or any one of examples 2-12, wherein the optical detection system is configured to detect a phase of the target RF electromagnetic radiation based on the output optical signals from the elongated slot.

Example 14. The system of example 1 or any one of examples 2-13, wherein the optical detection system is configured to detect a polarization of the target RF electromagnetic radiation based on the output optical signals from the elongated slot.

Example 15. The system of example 1 or any one of examples 2-14, wherein the optical detection system is configured to detect a frequency of the target RF electromagnetic radiation based on the output optical signals from the elongated slot.

In some aspects of what is described, a method for sensing RF electromagnetic radiation may be described by the following examples:

Example 1. A method for sensing radio frequency (RF) electromagnetic radiation, the method comprising:
  receiving RF electromagnetic radiation at a receiver formed of dielectric material, the receiver comprising:
    a photonic crystal structure having an elongated slot disposed therein,
    an antenna structure extending from the photonic crystal structure and configured to couple to a target RF electromagnetic radiation having a frequency in a range from 100 MHz-1 THz, and
    a vapor in the elongated slot;
  generating, by operation of a laser system, input optical signals adapted to interact with electronic transitions of the vapor;
  passing the input optical signals through the vapor in the elongated slot thereby producing one or more output optical signals; and
  determining, by operation of an optical detection system, a property of the received RF electromagnetic radiation by measuring a property of the one or more output optical signals.

Example 2. The method of example 1, wherein the received RF electromagnetic radiation has a frequency in a range from 100 MHz-1 THz.

Example 3. The method of example 1 or example 2, wherein receiving RF electromagnetic radiation comprises filtering a polarization of the RF electromagnetic radiation using a polarizer integral to the antenna structure.

Example 4. The method of example 1 or any one of examples 2-3, wherein receiving RF electromagnetic radiation comprises coupling the received RF electromagnetic radiation to the elongated slot using a taper internal to the antenna structure.

Example 5. The method of example 1 or any one of examples 2-4, wherein receiving RF electromagnetic radiation comprises interacting the received RF electromagnetic radiation with the photonic crystal structure.

Example 6. The method of example 5, wherein interacting the received RF electromagnetic radiation comprises decreasing a group velocity of the received RF electromagnetic radiation along a direction defined by a defect in the photonic crystal structure.

Example 7. The method of example 5 or example 6, wherein interacting the received RF electromagnetic radiation comprises concentrating the received RF electromagnetic radiation in the elongated slot.

Example 8. The method of example 1 or any one of examples 2-7, wherein receiving RF electromagnetic radiation comprises focusing, by operation of a dish, the received RF electromagnetic radiation on the antenna structure.

Example 9. The method of example 8, comprising:
  generating, by operation of a phase-stable source of electromagnetic radiation, a reference electromagnetic radiation having a frequency at or near a frequency of the target RF electromagnetic radiation; and
  directing the reference electromagnetic radiation towards the receiver using a focusing element disposed at an apex of the dish.

Example 10. The method of example 1 or any one of examples 2-9, comprising:
  propagating the input optical signals through a fiber optic assembly coupled to an end of the elongated slot.

Example 11. The method of example 10,
  wherein the end of the elongated slot comprises a mirror angled relative to an optical pathway defined by the elongated slot; and
  wherein passing the input optical signals through the vapor comprises reflecting the input optical signals from the fiber optic assembly off the mirror and along the optical pathway.

Example 12. The method of example 1 or any one of examples 2-11, wherein passing the input optical signals comprises propagating the input signals along an optical pathway defined by the elongated slot.

Example 13. The method of example 12,
  wherein the elongated slot comprises a mirror disposed at an end of the elongated slot, the mirror angled perpendicular to the optical pathway; and
  wherein propagating the input signals comprises reflecting the input optical signals off the mirror back down the optical path.

Example 14. The method of example 1 or any one of examples 2-13, wherein the property of the received RF electromagnetic radiation comprises an electric field magnitude.

Example 15. The method of example 1 or any one of examples 2-14, wherein the property of the received RF electromagnetic radiation comprises a phase.

Example 16. The method of example 1 or any one of examples 2-15, wherein the property of the received RF electromagnetic radiation comprises a polarization.

Example 17. The method of example 1 or any one of examples 2-16, wherein the property of the received RF electromagnetic radiation comprises a frequency.

Example 18. The method of example 1 or any one of examples 2-17, wherein the property of the one or more output optical signals comprises an electric field magnitude.

Example 19. The method of example 1 or any one of examples 2-18, wherein the property of the one or more output optical signals comprises a phase.

Example 20. The method of example 1 or any one of examples 2-19, wherein the property of the one or more output optical signals comprises a polarization.

Example 21. The method of example 1 or any one of examples 2-20, wherein the property of the one or more output optical signals comprises a frequency.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A receiver for sensing radio frequency (RF) electromagnetic radiation, the receiver comprising:
    a dielectric body comprising:
        an array of cavities ordered periodically to define a photonic crystal structure in the dielectric body,
        a region in the array of cavities defining a defect in the photonic crystal structure, and
        an elongated slot through the region extending from a slot opening in a surface of the dielectric body at least partially through the dielectric body;
    a vapor or a source of the vapor in the elongated slot; and
    an optical window covering the elongated slot and having a window surface bonded to the surface of the dielectric body to form a seal about the slot opening.

2. The receiver of claim 1, wherein the photonic crystal structure is configured to decrease a group velocity of a target RF electromagnetic radiation having a frequency in a range from 100 MHz to 1 THz.

3. The receiver of claim 1, wherein the photonic crystal structure is configured to concentrate a target RF electromagnetic radiation in the elongated slot, the target RF electromagnetic radiation having a frequency in a range from 100 MHz to 1 THz.

4. The receiver of claim 1, wherein the array of cavities comprises one or more offset cavities that are spatially offset from an ideal periodic position in the array.

5. The receiver of claim 4, wherein the one or more offset cavities reside nearest an end of the elongated slot and have respective spatial offsets away from the end of the elongated slot.

6. The receiver of claim 4, wherein the one or more offset cavities reside nearest a side of the elongated slot and have respective spatial offsets away from the side of the elongated slot.

7. The receiver of claim 1, comprising a mirror disposed at an end of the elongated slot.

8. The receiver of claim 7, wherein the mirror is angled relative to an optical pathway defined by the elongated slot.

9. The receiver of claim 7, wherein the mirror is perpendicular to an optical pathway defined by the elongated slot.

10. The receiver of claim 1, wherein the dielectric body comprises an antenna structure extending from an end of the dielectric body along an axis.

11. The receiver of claim 10, wherein the antenna structure is configured to couple to a target RF electromagnetic radiation having a frequency in a range from 100 MHz to 1 THz.

12. The receiver of claim 10, wherein the antenna structure terminates in a tapered end and comprises:
    a narrow portion aligned with the tapered end; and
    an array of co-planar segments extending outward from the narrow portion and having a periodic spacing therealong, the array of co-planar segments configured to filter a polarization of the target RF electromagnetic radiation.

13. The receiver of claim 10, wherein the antenna structure comprises one or more channels defining a taper internal to the antenna structure, the taper configured to couple electromagnetic radiation received by the antenna structure to the elongated slot.

14. The receiver of claim 1, wherein the photonic crystal structure defines a photonic band gap associated with a transverse magnetic (TM) mode of RF electromagnetic radiation.

15. The receiver of claim 1, wherein the photonic crystal structure defines a photonic band gap associated with a transverse electric (TE) mode of RF electromagnetic radiation.

16. The receiver of claim 1, wherein the vapor comprises a gas of alkali-metal atoms.

17. The receiver of claim 1,
    wherein the surface of the dielectric body defines a cavity opening for each of the array of cavities;
    wherein the optical window covers each of the cavity openings; and
    wherein the window surface forms a seal about each of the cavity openings.

18. The receiver of claim 1,
    wherein the surface of the dielectric body is a first surface and the dielectric body comprises a second surface opposite the first surface;
    wherein the elongated slot extends through the dielectric body from the first surface to the second surface;
    wherein the slot opening is a first slot opening and the second surface of the dielectric body defines a second slot opening of the elongated slot;
    wherein the optical window is a first optical window and the window surface is a first window surface; and
    wherein the receiver comprises a second optical window covering the second slot opening and having a second window surface bonded to the second surface to form a seal about the second slot opening.

19. The receiver of claim 18,
    wherein the first and second surfaces of the dielectric body define, respectively, first and second cavity openings for each of the array of cavities;
    wherein the first and second optical windows cover, respectively, each of the first and second cavity openings; and
    wherein the first and second window surfaces form respective seals about each of the first and second cavity openings.

20. A method for sensing radio frequency (RF) electromagnetic radiation, the method comprising:
    receiving RF electromagnetic radiation at an antenna structure of a dielectric body, the dielectric body comprising:
        the antenna structure, configured to couple to a target RF electromagnetic radiation having a frequency in a range from 100 MHz to 1 THz,
        an array of cavities ordered periodically to define a photonic crystal structure in the dielectric body,
        a region in the array of cavities defining a defect in the photonic crystal structure, and
        an elongated slot through the region extending from a slot opening in a surface of the dielectric body at least partially through the dielectric body;
    interacting the received RF electromagnetic radiation with the photonic crystal structure; and
    passing input optical signals through a vapor in the elongated slot to generate one or more output optical signals.

21. The method of claim 20, comprising:
coupling the received RF electromagnetic radiation to the elongated slot using a taper internal to the antenna structure.

22. The method of claim 21,
wherein the taper is defined by one or more channels in the antenna structure; and
wherein the taper has an apex aligned with the elongated slot.

23. The method of claim 20,
wherein the region in the array of cavities extends along an axis and the elongated slot is aligned parallel to the axis; and
wherein interacting the received RF electromagnetic radiation comprises decreasing a group velocity of the received RF electromagnetic radiation along a direction parallel to the axis.

24. The method of claim 20, wherein interacting the received RF electromagnetic radiation comprises concentrating the received RF electromagnetic radiation in the elongated slot.

25. The method of claim 20,
wherein the array of cavities comprises one or more offset cavities that are spatially offset from an ideal periodic position in the array, the offset cavities defining a photonic crystal mirror; and
wherein interacting the received RF electromagnetic radiation comprises reflecting the received RF electromagnetic radiation off the photonic crystal mirror.

26. The method of claim 20, wherein passing input optical signals comprises reflecting the input optical signals off a mirror disposed at an end of the elongated slot.

27. The method of claim 20, wherein receiving RF electromagnetic radiation comprises filtering a polarization of the received RF electromagnetic radiation using a polarizer integral to the antenna structure.

28. The method of claim 27,
wherein the antenna structure extends along an axis and terminates in a tapered end; and
wherein the polarizer comprises:
a narrow portion of the antenna structure aligned with the tapered end; and
an array of co-planar segments extending outward from the narrow portion and having a periodic spacing therealong.

29. The method of claim 20, wherein passing the input optical signals comprises propagating the input optical signals along an optical pathway defined by the elongated slot.

30. The method of claim 20, wherein the vapor comprises a gas of alkali-metal atoms.

* * * * *

UNITED STATES PATENT AND TRADEMARK OFFICE
CERTIFICATE OF CORRECTION

PATENT NO. : 11,137,432 B1  
APPLICATION NO. : 17/142012  
DATED : October 5, 2021  
INVENTOR(S) : Amarloo et al.

Page 1 of 1

It is certified that error appears in the above-identified patent and that said Letters Patent is hereby corrected as shown below:

On the Title Page

Column 1, Line 1, After "2021", insert -- ¶(65) Prior Publication Data
US 2021/0285992 A1 Sep. 16, 2021 --

In the Specification

Column 8, Line 8, Delete "150" and insert -- 156 -- therefor

Column 11, Line 22, Delete "152" and insert -- 150 -- therefor

Figure 5A:
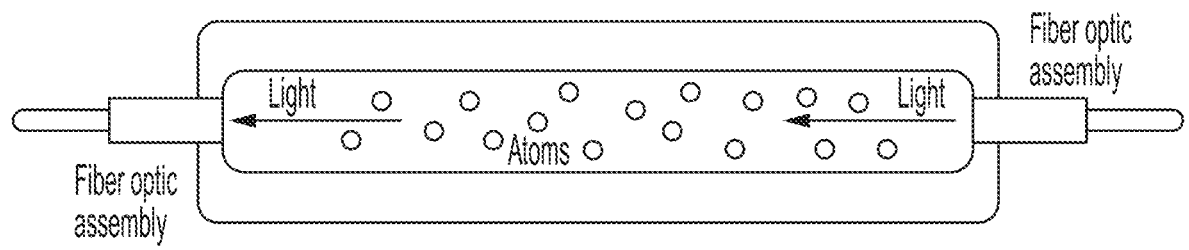
FIGS. 5A, 5B, 5C, 5D, and 5E are schematic diagrams, in cross-section, of alternate configurations of a photonic crystal frame, each configuration having a different arrangement of fiber optic assemblies coupled to a photonic crystal frame.
Figure 5B:
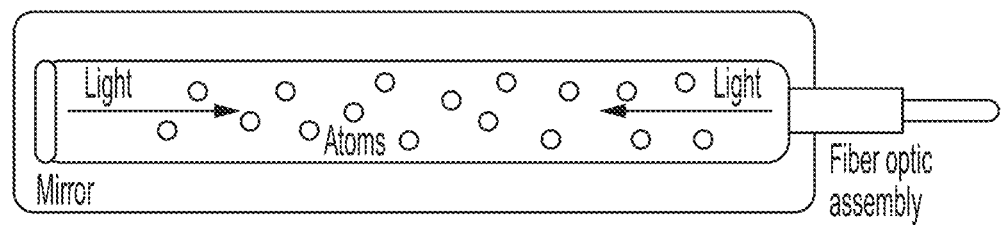
Figure 5C:
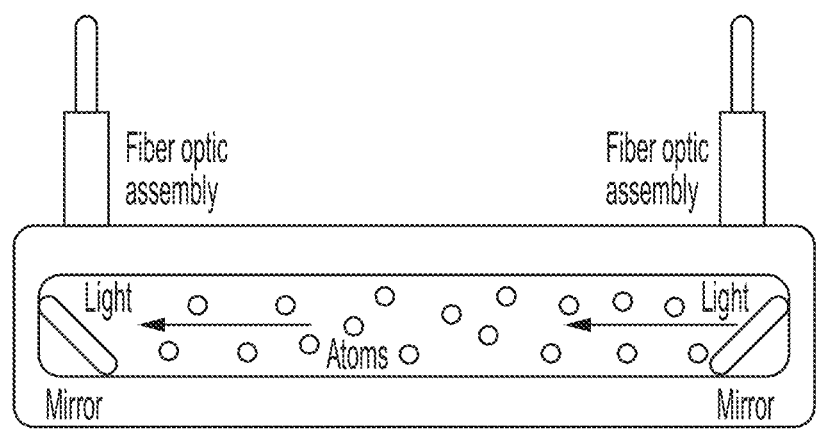
Figure 5D:
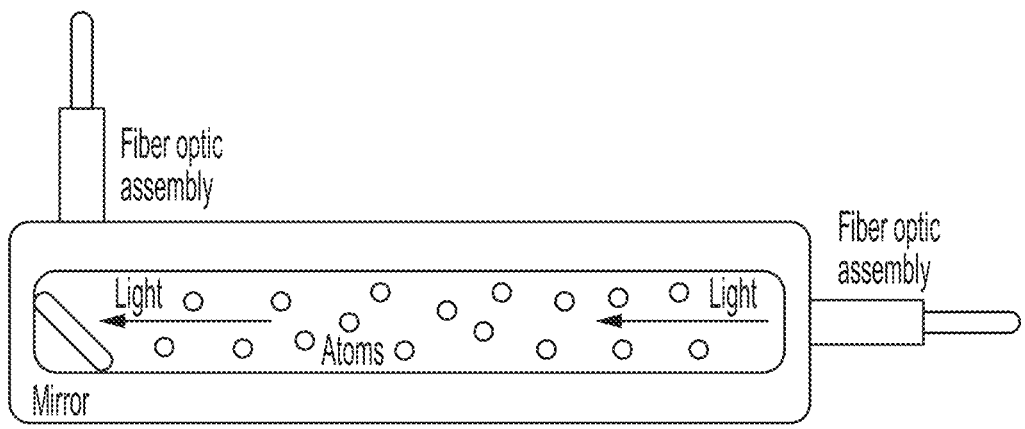
Figure 5E:
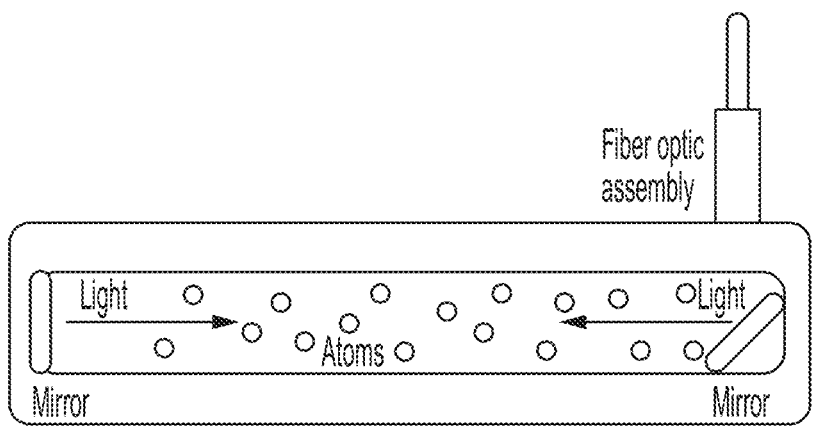

Column 11, Line 52, Delete "FIGS. 5A-SE." and insert -- FIGS. 5A-5E. -- therefor Column 18, Lines 33-34, Delete "FIGS. SB and SE)." and insert -- FIGS. 5B and 5E). -- therefor Column 18, Line 64, Delete "Nz." and insert -- $N_2$. -- therefor Column 21, Line 46, Delete "1608" and insert -- 1606 -- therefor Column 21, Line 49, Delete "1608" and insert -- 1606 -- therefor Column 21, Line 57, Delete "1608" and insert -- 1606 -- therefor Column 26, Line 9, Delete "photonic crystal receiver" and insert -- system -- therefor Column 28, Line 21, Delete "path." and insert -- pathway. -- therefor Signed and Sealed this
Fourteenth Day of December, 2021

Drew Hirshfeld
*Performing the Functions and Duties of the
Under Secretary of Commerce for Intellectual Property and
Director of the United States Patent and Trademark Office*